United States Patent
Morita et al.

(10) Patent No.: US 8,063,611 B2
(45) Date of Patent: Nov. 22, 2011

(54) ACCUMULATOR

(75) Inventors: Kazuki Morita, Osaka (JP); Yoshimitu Odajima, Osaka (JP)

(73) Assignee: Panasonic Corporation, Osaka (JP)

( * ) Notice: Subject to any disclaimer, the term of this patent is extended or adjusted under 35 U.S.C. 154(b) by 396 days.

(21) Appl. No.: 12/439,560

(22) PCT Filed: Sep. 5, 2007

(86) PCT No.: PCT/JP2007/067253
§ 371 (c)(1),
(2), (4) Date: Mar. 2, 2009

(87) PCT Pub. No.: WO2008/029820
PCT Pub. Date: Mar. 13, 2008

(65) Prior Publication Data
US 2010/0007213 A1   Jan. 14, 2010

(30) Foreign Application Priority Data
Sep. 8, 2006 (JP) .................... 2006-243700

(51) Int. Cl.
*H02J 7/04* (2006.01)
*H20M 7/219* (2006.01)
*H10M 10/46* (2006.01)
*H20H 7/122* (2006.01)

(52) U.S. Cl. ........ 320/148; 320/134; 320/136; 320/166; 307/103; 307/109; 307/110; 363/59; 363/60

(58) Field of Classification Search .................. 320/166; 307/109, 110; 363/59, 60
See application file for complete search history.

(56) References Cited

U.S. PATENT DOCUMENTS

| | | | | |
|---|---|---|---|---|
| 4,667,143 A * | 5/1987 | Cooper et al. | ................. | 320/153 |
| 5,177,677 A * | 1/1993 | Nakata et al. | .................... | 363/89 |
| 5,345,163 A * | 9/1994 | Gibbons et al. | ................ | 320/163 |
| 5,821,735 A * | 10/1998 | Scharff | .......................... | 320/125 |
| 7,821,800 B2 * | 10/2010 | Chiang | .......................... | 363/56.1 |
| 2003/0057920 A1 * | 3/2003 | Dotzler | .......................... | 320/162 |

FOREIGN PATENT DOCUMENTS

| | | |
|---|---|---|
| JP | 2000-13910 A | 1/2000 |
| JP | 2002-252901 A | 9/2002 |
| JP | 2004-134129 A | 4/2004 |
| JP | 2005-28908 A | 2/2005 |

OTHER PUBLICATIONS

International Search Report for PCT/JP2007/067253, Dec. 18, 2007.

* cited by examiner

*Primary Examiner* — Patrick Assouad
*Assistant Examiner* — Steve T Chung
(74) *Attorney, Agent, or Firm* — RatnerPrestia

(57) ABSTRACT

A DC blocking capacitor and a resistor are coupled in series, and coupled in parallel with an electricity storing section. An ON/OFF circuit and a peak voltage holding circuit are coupled in parallel with the resistor. A current sensing section is coupled in series with the storing section, with its output supplied to the peak current holding circuit. Current from a positive to a negative electrode of the storing section is referred to as a positive direction. The ON/OFF circuit is turned on when the current flows in a negative direction, and is turned off when the current flows in the positive direction. An internal resistor of the storing section is found based on a peak voltage and a peak current resulting from the control and held by the respective circuits. A degree of degradation of the electricity storing section is determined with this internal resistor.

8 Claims, 15 Drawing Sheets

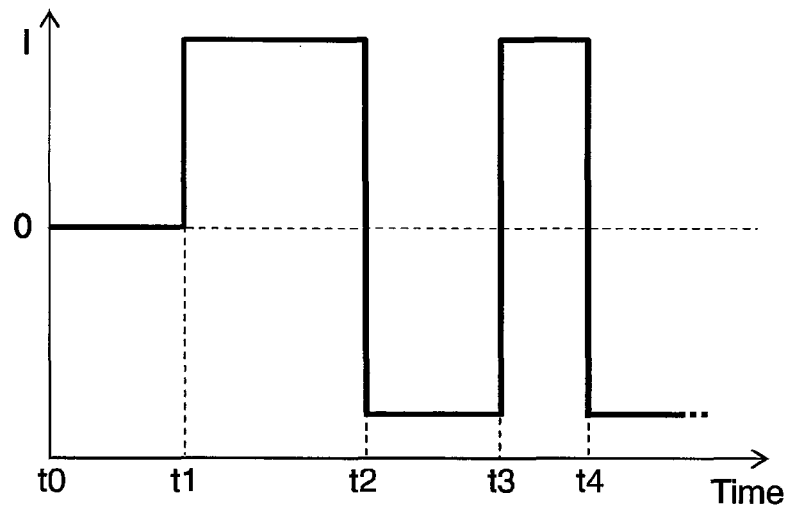
FIG. 9A
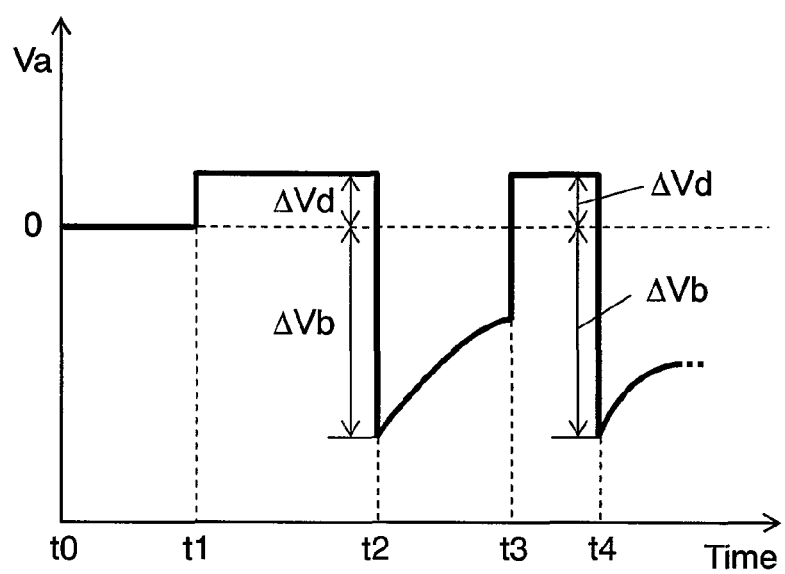
FIG. 9B
FIG. 9C
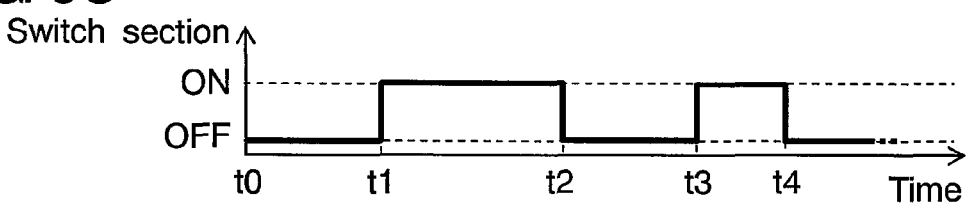
FIG. 9D
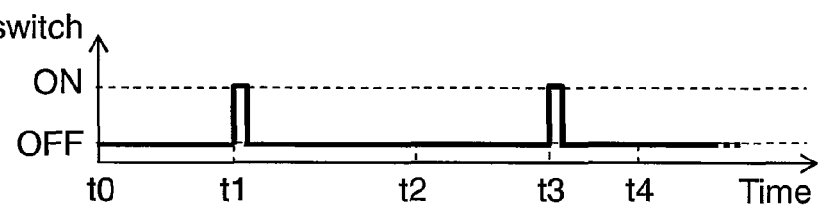

ACCUMULATOR

This application is a U.S. National Phase Application of PCT International Application PCT/JP2007/067253.

TECHNICAL FIELD

The present invention relates to an electric storage device employing electricity storing sections formed of capacitors.

BACKGROUND ART

In recent years, cars have been equipped with an idling stop function which stops an engine when the car comes to a stop, or an electric power steering wheel which takes the load off the engine. These two items contribute environmental protection and fuel saving. A hybrid system or an electric turbo system, which positively complements the drive of engine, will be used widely in the market. On top of that, car manufacturers have proposed various ideas about a car brake such as an electrical hydraulic brake that will replace a conventional mechanical hydraulic brake.

As discussed above, the car tends to need electric power increasingly from now on; however, a battery, having conventionally supplied power to the car, cannot supply an instantaneous large amount of power only by itself, so that it sometimes fails to supply sufficient power. If the battery becomes abnormal, the driving system possibly fails to work normally.

To overcome the foregoing problems, an electric storage device is proposed as an auxiliary power supply for supplying enough power when the battery falls into abnormal operation. The electric storage device is disclosed in, e.g. patent document 1, which refers to the electric storage device, in particular, a backup power-supply unit for supplying power to an electronic controller of a system when the battery falls into abnormal operation.

FIG. 14 shows a block diagram of a conventional electric storage device. In FIG. 14, an electrically double-layered capacitor having large capacitance is used as a capacitor for storing electric power. Multiple capacitors are coupled together to form capacitor unit 101 working as an electricity storing section. Capacitor unit 101 has charging circuit 103 and discharging circuit 105 coupled thereto for controlling the charging and discharging of capacitor unit 101, while these circuits are controlled by microprocessor 107. Voltage sensor 109 is connected to microprocessor 107 for sensing abnormal operation of a battery, while it is coupled to FET switch 111 which supplies power to capacitor unit 101 when sensor 109 senses abnormality.

Electric storage device 113 structured above and working as a backup power-supply unit is coupled between battery 115 and electronic controller 117 working as a load. Storage device 113 is controlled its start and halt by ignition switch 119.

Assume that electronic controller 117 is employed in an electric braking system of a vehicle, then controller 117 must be kept driving to allow applying a brake when battery 115 falls in abnormal operation. In such a case, when voltage sensor 109 senses an abnormality of battery 115, FET switch 111 is turned on so that capacitor unit 101 can supply power to controller 117, thereby overcoming the abnormality of battery 115.

Capacitor unit 101 basically works as an auxiliary power supply with the structure and operation discussed above. However, since the electrically double-layered capacitor forming capacitor unit 101 is degraded time-dependently, capacitor unit 101 needs to be monitored its degradation in order to drive controller 117 at any time, and a degradation should be reported to an operator. The electric storage device thus needs the foregoing functions in order to maintain highly reliable operation. The conventional electric storage device thus monitors the changes in its internal resistance value "R" and capacitance "C" which vary in response to the degradation of capacitor unit 101.

Since the values of internal resistance "R" and capacitance "C" are found when capacitor unit 101 is charged, a method of charging the capacitor unit 101 is firstly described hereinafter. FIG. 15 shows variation with time in the voltage of capacitor unit 101 during the charge to the conventional electric storage device. The horizontal axis represents time "t" while the vertical axis represents voltage "V" of capacitor unit 101. In FIG. 15, charging circuit 103 supplies a given current "I" at time "t0" from battery 115 to capacitor unit 101 in order to charge capacitor unit 101. At this instant, voltage "V" rises proportionately to internal resistor R of capacitor unit 101, and then voltage "V" rises linearly due to a charge with a constant current as shown in FIG. 15.

Charging circuit 103 interrupts the charge temporarily (e.g. at time "t1") in the course of the charging, so that voltage "V" lowers proportionately to internal resistance "R" as shown in FIG. 15. However, since capacitor unit 101 has stored electric charges, voltage "V" will not lower more than a value caused by internal resistor "R"before it settles down at a certain value. Then the charge starts again at time "t2", and voltage "V" rises proportionately to internal resistor "R" as it has risen at time "t0". The voltage "V" linearly rises in the course of the charge before capacitor unit 101 is fully charged at time "t3". The charge then halts and voltage "V" stays at a certain value.

Capacitor unit 101 is thus charged and the values of its internal resistor "R" and capacitance "C" are found in the course of the charge. First, internal resistor "R" can be found by measuring the rises of voltage "V" at time "t0" and "t2" or the fall of voltage "V" at time "t1". A voltage sensing section built in charging circuit 103 can find these rises or a fall in the voltage.

To be more specific, the range of rise or fall (hereinafter referred to as a voltage variable range "ΔV") of voltage "V" changes proportionately to internal resistance "R", so that the voltage sensing section finds the voltage variable range "ΔV" at any one of time "t0", "t1", and "t2". Since current "I" to be used for charging capacitor unit 101 has a known and predetermined value, internal resistance "R" can be found by the equation: $\Delta V = R \times I$. The voltage variable range "ΔV" can be found at any one of time "t0", "t1", and "t2", however, since time "to" comes right after the start, a greater measurement error can be expected, so that the variable range "ΔV" found at time "t1" or "t2", at which the charge is interrupted temporarily, is preferably used.

Next, capacitance "C" is found from an inclination "V/t" during the time span of t0-t1 or t2-t3 in the graph shown in FIG. 15. To be more specific, electric charge amount "Q" of capacitor unit 101 can be found by the equation: $Q = C \times V$, while $Q = I \times t$ is established, so that $C = I \times (t/V)$ is satisfied. Accordingly, capacitance "C" can be found by multiplying an inverse number of the inclination V/t of the graph by current "I". In the foregoing discussion, the way of finding "R" and "C" during the charge of capacitor unit 101 is described; however, they can be found in a similar way during the discharge, with a constant current, from capacitor unit 101.

The "R" and "C" thus found are compared with a degradation limit found in advance, thereby determining how much the capacitor unit 101 is degraded. A reliable electric storage device has been thus obtained.

The foregoing conventional electric storage device can indeed determine how much its capacitor unit 101 is degraded, and thus maintain the reliability at a high level, but the "R" and "C" can be actually found during the charge or discharge only with a constant current. If the load coupled to the electric storage device is, e.g. a motor of a hybrid system, capacitor unit 101 undergoes charges/discharges with a large current repeated frequently in a short time. The conventional method is thus not suitable for finding internal resistance "R" among others.

Patent Document 1: Japanese Unexamined Patent Publication No. 2005-28908

DISCLOSURE OF INVENTION

The present invention aims to provide a highly reliable electric storage device that can find accurately an internal resistance of its electricity storing section even if an electric current varies greatly and unsteadily within a short time.

The electric storage device of the present invention comprises the following elements:
- a current sensing section for sensing an electric current of the electricity storing section;
- a DC blocking capacitor coupled to a positive electrode of the electricity storing section;
- a resistor coupled in series with the DC blocking capacitor and coupled to a negative electrode of the electricity storing section;
- an ON/OFF circuit coupled in parallel with the resistor;
- a peak voltage holding circuit;
- a peak current holding circuit coupled to the current sensing section; and
- a controller for controlling the peak voltage holding circuit, the peak current holding circuit, and the current sensing section. Assume that a flowing direction of an electric current from the positive electrode to the negative electrode of the electricity storing section is positive, and then the ON/OFF circuit is controlled to be turned on when the current flows along a negative direction or a voltage at a junction point between the DC blocking capacitor and the resistor is negative. On the other hand, the ON/OFF circuit is controlled to be turned off when the current flows along the positive direction or a voltage at the foregoing junction point is positive. This control results in obtaining a peak voltage held by the peak voltage holding circuit and a peak current held by the peak current holding circuit, and an internal resistance of the electricity storing section can be found based on these peak values.

The structure discussed above allows the ON/OFF circuit to be turned on when the current flows along the negative direction or the voltage at the junction point between the DC blocking capacitor and the resistor is negative, whereby the voltage falls at 0 (zero) volt or a predetermined reference voltage. While this status is maintained, the ON/OFF circuit is turned off when the current flows along the positive direction or the voltage at the foregoing junction point becomes positive, so that a voltage variable range from the reference voltage can be accurately measured.

The electric storage device of the present invention allows obtaining accurately a voltage variable range from the reference voltage even when the electric current changes greatly and unsteadily within a short time. As a result, the internal resistance of the electricity storing section is accurately obtainable, so that an accuracy of determining the degradation can be improved, which allows achieving a highly reliable electric storage device.

BRIEF DESCRIPTION OF DRAWINGS

FIG. 9A shows an electric current varying with time and used for charging or discharging an electricity storing section of the electric storage device in accordance with the fourth embodiment of the present invention.

FIG. 9B shows an input voltage varying with time and supplied to a bottom voltage holding circuit of the electric storage device in accordance with the fourth embodiment of the present invention.

FIG. 9C shows a timing chart of ON and OFF of an ON/OFF circuit of the electric storage device in accordance with the fourth embodiment of the present invention.

FIG. 9D shows a timing chart of ON and OFF of a reset switch of the electric storage device in accordance with the fourth embodiment of the present invention.

Figure 1:
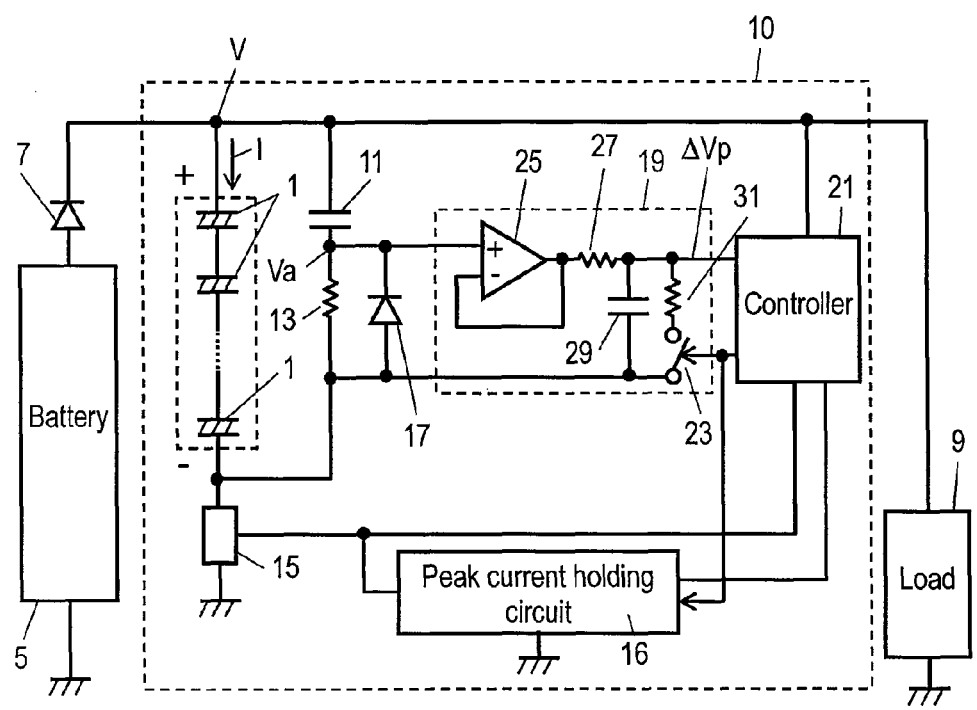
FIG. 1 shows a block diagram of an electric storage device in accordance with a first embodiment of the present invention.

DESCRIPTION OF REFERENCE MARKS 1. electricity storing section
10. electric storage device
11. DC blocking capacitor
13. resistor
15. current sensing section
16. peak current holding circuit
17. ON/OFF circuit
19. peak voltage holding circuit
21. controller
33. determining circuit
40. bottom voltage holding circuit
45. bottom current holding circuit

PREFERRED EMBODIMENTS OF THE INVENTION

Exemplary embodiments of the present invention are demonstrated hereinafter with reference to the accompanying drawings. The following descriptions refer to electric storage devices employed in a hybrid vehicle.

Embodiment 1

FIG. 1 shows a block diagram of an electric storage device in accordance with the first embodiment of the present invention. In FIG. 1, electricity storing section 1 employs an electrically double-layered capacitor having a rated voltage of 2.5V as a capacitor for storing electric power. Multiple capacitors discussed above are coupled together in series for storing necessary power. Electricity storing section 1 is connected via switch 7 to battery 5 working as a primary power source. Switch 7 can be turned on or off and formed of a diode. If electricity storing section 1 is not yet charged, its voltage is lower than that of battery 5, so that switch 7 is turned on for charging electricity storing section 1.

Electricity storing section 1 is coupled to load 9, such as a motor of a hybrid vehicle, and load 9 consumes a large current when the vehicle is accelerated; however, battery 5 cannot supply by itself such an instantaneous large current. To overcome this drawback, the first embodiment allows electricity storing section 1 to supply power to load 9 because when battery 5 is lowered its voltage due to the large current consumption, voltage "V" of electricity storing section 1 fully charged becomes higher than the voltage of battery 5. Switch 7 is then turned off, and storing section 1 can supply power to load 9. At this time, the capacitors employed in electricity storing section 1 are so excellent in quick charge/discharge that they can supply an instantaneous large current to load 9. Since switch 7 is turned off, an electric current cannot flow from electricity storing section 1 to battery 5, so that the power stored in storing section 1 can be efficiently supplied to load 9. The voltage of storing section 1 lowers with time, so that the voltage of battery 5, which recovers its energy while switch 7 is turned off, becomes higher in due course than the voltage of storing section 1. In this case, switch 7 is turned on, and battery 5 supplies power to load 9.

A structure of electric storage device 10 is detailed hereinafter. A peak voltage holding circuit, which catches voltage variation in response to changes in the electric current flowing to electricity storing section 1, and a peak current holding circuit, which finds a maximum current value, are needed to find internal resistance "R" when the electric current changes unsteadily and greatly within a short time. Both of these two circuits allow finding a maximum voltage variation value "$\Delta Vp$" and a maximum current value "Ip", so that "R" can be found from the equation of $R=\Delta Vp/Ip$. Capacitance "C" can be found by using a generalized equation of $C=I \times t/V$, which is conventionally used for finding capacitance "C" when a charge/discharge is done with a constant current. To be more specific, difference $\Delta V$ ($=V2-V1$) between voltage V1 of electricity storing section 1 at any time t and voltage V2 at time t' after a given time passed from time t. On top of that, a time quadrature value of current variation during the given time, i.e. $\int Idt$, should be found. Capacitance "C" can be found from the equation of $C=\int Idt/\Delta V$. The electric storage device in accordance with the first embodiment is thus provided with the peak voltage holding circuit and the peak current holding circuit particularly focused on accurately finding internal resistance "R". A specific construction of the electric storage device is demonstrated hereinafter.

A first end of DC blocking capacitor 11 is coupled to the positive electrode of electricity storing section 1 for sensing voltage variation by holding a peak voltage, and a second end thereof is coupled to a first end of resistor 13, of which second end is coupled to the negative electrode of electricity storing section 1. A voltage at the junction point between capacitor 11 and resistor 13, i.e. voltage "Va", which is detailed later, to be supplied to peak voltage holding circuit 19, is a voltage of only a varied component remaining after a DC component is cut from voltage "V" of electricity storing section 1.

Current sensing section 15 is coupled in series to electricity storing section 1 in order to sense unsteady current variation. Current sensing section 15 can be structured to find an electric current based on a voltage across a resistor (not shown) having an extremely low resistance, or to find the electric current by converting a current into a voltage with a current sensor provided in a non-contact manner to a wiring that connects the negative electrode of storing section 1 to the ground. In either one of the foregoing structures, a resistance between the negative electrode of electricity storing section 1 and the grounding of current sensing section 15 is extremely small. An output terminal of current sensing section 1 is coupled to peak current holding circuit 16 which holds a peak current.

Resistor 13 is coupled in parallel to ON/OFF circuit 17, to which peak voltage holding circuit 19 is coupled in parallel. ON/OFF circuit 17 can be any type insofar as having two states, i.e. ON and OFF. In this first embodiment, ON/OFF circuit 17 employs a diode of which cathode is coupled to the junction point of DC blocking capacitor 11 and resistor 13.

Peak current holding circuit 16 and peak voltage holding circuit 19 are coupled to controller 21, which is coupled to an output terminal of current sensing section 15 and the positive electrode of electricity storing section 1. This structure allows controller 21 to catch respective outputs from peak current holding circuit 16, peak voltage holding circuit 19, and current sensing section 15 as well as voltage "V" of electricity storing section 1 in addition to controlling circuit 16 and reset switch 23 built in circuit 19.

Next, a structure of peak voltage holding circuit 19 is detailed hereinafter. A structure of peak current holding circuit 16 is similar to that of circuit 19, so that circuit 19 is representatively demonstrated here. An input to circuit 19 is supplied from the junction point of DC blocking capacitor 11 and resistor 13, and this input is supplied to a first end of peak holding capacitor 29 via operational amplifier (OP amp) 25 as well as resistor 27. Since OP amp 25 holds a peak value when input voltage "Va" stays positive, it works as a buffer amplifier. A second end of capacitor 29 is grounded via current sensing section 15. Peak holding capacitor 29 holds a maximum value of input voltage "Va" supplied to peak voltage holding circuit 19. To be more specific, capacitor 29 stores electric charges in response to the maximum voltage variation, whereby a voltage across capacitor 29 varies proportionately to peak voltage ΔVp to be held. The voltage across capacitor 29 is then caught by controller 21. Capacitor 29 having a small capacity is used in order to quickly sense the maximum peak voltage ΔVp to be held.

Peak holding capacitor 29 only holds a voltage greater than the present one, so that the voltage across capacitor 29 should be reset for holding another peak voltage during a coming new time interval. For this resetting purpose, a first end of reset switch 23 is coupled in parallel to capacitor 29 via resistor 31. A second end of reset switch 23 is grounded via current sensing section 15 as capacitor 29 is. Since reset switch 23 is controlled its on and off by controller 21, it can be turned on at any by a command from controller 21, thereby resetting the voltage value held at peak. To be more specific, reset switch 23 is turned on instantaneously, and then turned off, whereby electric charges stored due to the peak-hold in small-capacitive capacitor 29 are discharged instantaneously through resistor 31. As a result, the voltage across capacitor 29 falls into almost 0 (zero) volt, and it becomes ready to catch another peak voltage to be held.

Peak voltage holding circuit 19 senses peak voltage "ΔVp" to be held, and peak current holding current 16 senses and outputs the maximum value of current, i.e. peak current "Ip" to be held.

Next, the way of finding internal resistance "R" of electricity storing section 1 of electric storage device 10 is demonstrated hereinafter. As shown with an arrow mark in FIG. 1, the flowing direction of electric current from the positive electrode to the negative electrode of storing section 1 is defined as a positive direction. The charge of storing section 1 thus needs positive electric current (+I) and the discharge therefrom needs negative current (−I).

To exhibit the effectiveness of ON/OFF circuit 17, the structure shown in FIG. 1 is omitted ON/OFF circuit 17 intentionally, namely, peak voltage holding circuit 19 is simply provided to the structure. The operation of this structure is demonstrated with reference to FIGS. 2A-2C.

Figure 2A:
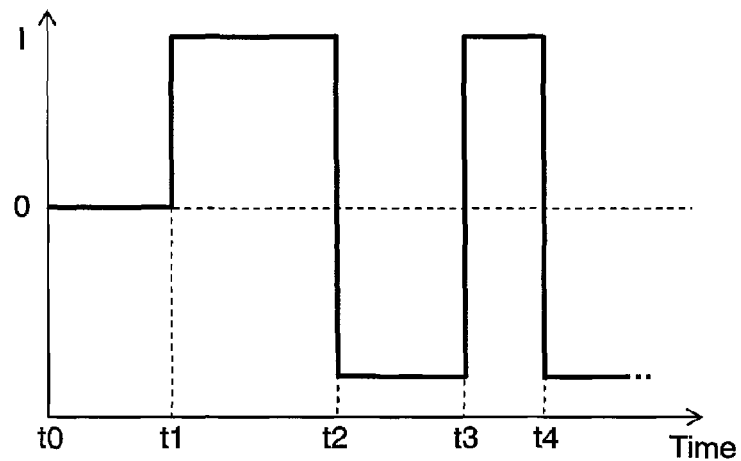
FIG. 2A shows an electric current varying with time and used for charging or discharging an electricity storing section of the electric storage device, having no ON/OFF circuit, in accordance with the first embodiment of the present invention.
Figure 2B:
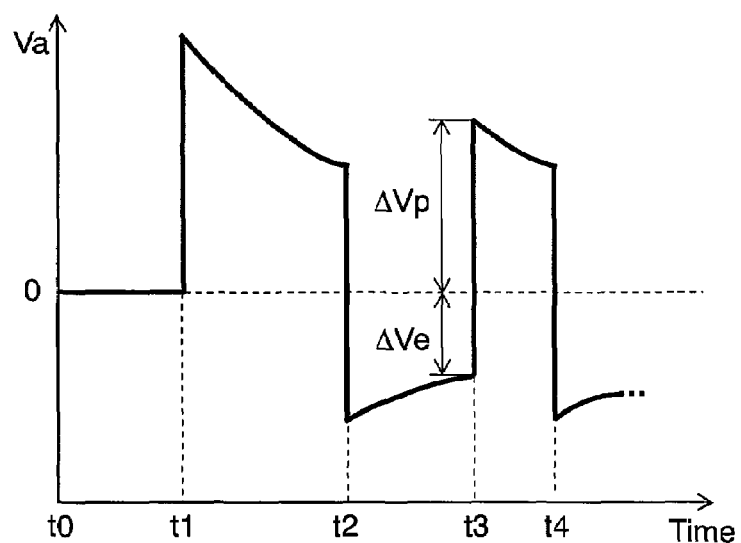
FIG. 2B shows an input voltage varying with time and supplied to a peak voltage holding circuit of the electric storage device, having no ON/OFF circuit, in accordance with the first embodiment of the present invention.
Figure 2C:
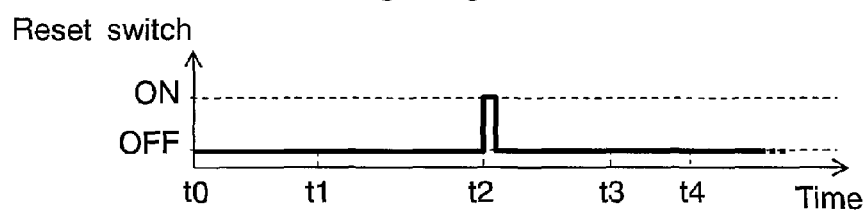
FIG. 2C shows a timing chart of ON and OFF of a reset switch of the electric storage device, having no ON/OFF circuit, in accordance with the first embodiment of the present invention.

FIG. 2A shows an electric current varying with time and used for charging or discharging the electricity storing section of the electric storage device, having no ON/OFF circuit, in accordance with the first embodiment of the present invention. FIG. 2B shows an input voltage varying with time and supplied to the peak voltage holding circuit of the electric storage device, having no ON/OFF circuit, in accordance with the first embodiment of the present invention. FIG. 2C shows a timing chart of ON and OFF of a reset switch of the electric storage device, having no ON/OFF circuit, in accordance with the first embodiment of the present invention.

A vehicle is not yet driven during time t0-t1, so that no current flows through electricity storing section 1 as shown in FIG. 2A and the state of I=0 (zero) remains as it is. Input voltage "Va" thus remains at Va=0 as shown in FIG. 2B. During this period, since it is not the time to hold a peak value for finding internal resistance "R", reset switch 23 stays turned off as shown in FIG. 2C.

Figure 15:
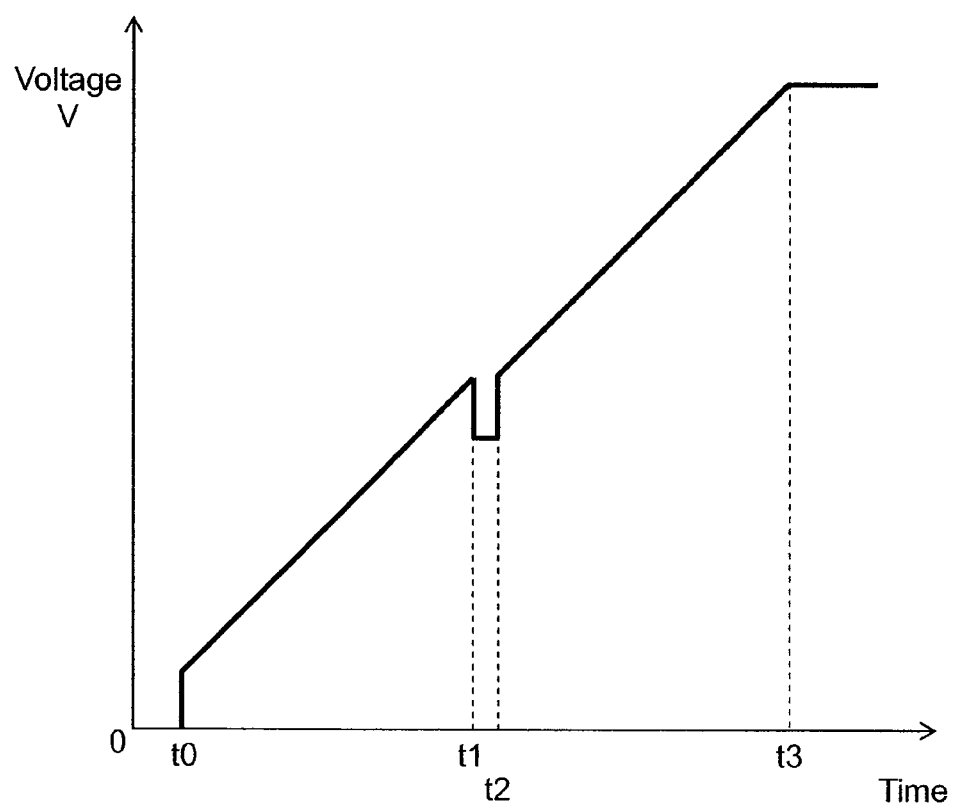
FIG. 15 shows a voltage, varying with time, of a capacitor unit of the conventional electric storage device during the charge of the device.

The vehicle is started at time "t1", which prompts positive current +I to flow for charging electricity storing section 1 as shown in FIG. 2A, then voltage "V" rises with time and a voltage-rise occurs in response to internal resistance "R" as shown at time "t0" in FIG. 15. In put voltage "Va" indicating a change amount in voltage "V" rises sharply at time "t1" as shown in FIG. 2B. Then voltage "V" rises approaching to a given inclination along the progress of time "t" in response to the stabilization of positive current "+I". Input voltage "Va" thus becomes smaller with time. A finding of peak voltage "ΔVp" to be held may accompany a great error therein because of the reason described in FIG. 15, so that reset switch 23 still remains turned off as shown in FIG. 2C.

Since the hybrid vehicle undergoes frequent repetitions of charges and discharges with an unsteady and large current, load 9 consumes a large amount of current with a short lapse of time before time "t2". Electricity storing section 1 supplies negative current "−I" as shown in FIG. 2A, but voltage "V" sharply falls at an instant of time "t2". Input voltage "Va" thus becomes negative one as shown in FIG. 2B. After that, electricity storing section 1 supplies a current to load 9, so that voltage "V" rises and input voltage "Va" approaches 0 (zero) volt with the progress of time. At time "t2", peak voltage holding circuit 19 and peak current holding circuit 16 are reset for finding internal resistance "R". To be more specific, as shown in FIG. 2C, reset switch 23 is turned on at time "t2", and then turned off immediately thereafter. Peak holding capacitor 29 built in peak voltage holding circuit 19 then discharges, so that the voltage across capacitor 29, i.e. peak voltage "ΔVp" to be held is reset. In a similar way, peak current value "Ip" to be held is reset in peak current circuit 16.

Load 9 ends its current consumption at time "t3", and then electricity storing section 1 is recharged. At this time, as shown in FIG. 2A, current "I" flows reversely (charging direction), and voltage "V" rises, so that input voltage "Va" becomes positive and rises sharply due to internal resistance "R" of electricity storing section 1. This voltage variation is greater than input voltage "Va" after time "t3", so that it is held by peak holding capacitor 29 as peak voltage "ΔVp". In a similar way, a maximum current value after time "3" is held as peak current "Ip". Since these peak values reflect internal resistance "R" of electricity storing section 1, controller 21 catches these peak values after time "t3", thereby finding internal resistance "R" from the equation of R=ΔVp/Ip. The work after time "t3" is similar to that after time "t1", so that the description thereof is omitted here.

The accuracy of peak voltage "ΔVp" is raised as a problem. As shown in FIG. 2B, peak voltage "ΔVp" is an amount measured from the grounding (=0 volt). However, since the first end of peak holding capacitor 29 is grounded via current sensing section 15, having an extremely small resistance, the voltage variable range proportionate to internal resistance "R" is a range varied from the negative voltage at time "t3", i.e. ΔVp+ΔVe, and the amount of "ΔVe" is an error in voltage. Voltage error "ΔVe" changes greatly and unsteadily depending on the current flowing direction, so that it cannot be corrected in advance.

The structure of electricity storing section 1 provided with only peak voltage holding circuit 19 thus cannot find accurately the peak voltage "ΔVp", so that an error in internal resistance "R" becomes greater. ON/OFF circuit 17 is needed for this reason. The structure additionally provided with ON/OFF circuit 17 and shown in FIG. 1 is demonstrated hereinafter with reference to FIGS. 3A-3D.

Figure 3A:
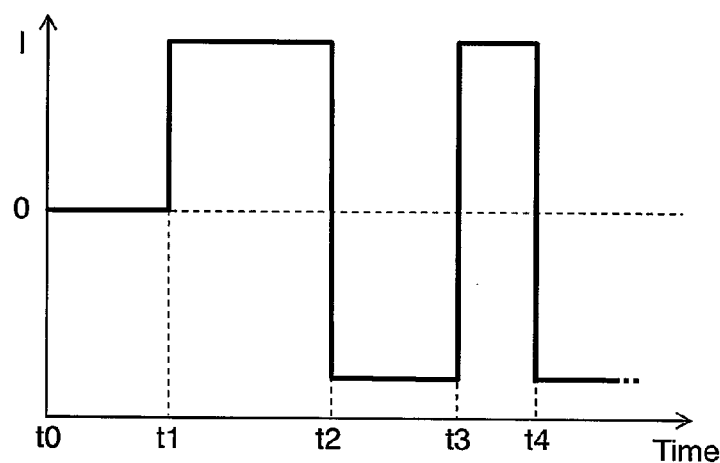
FIG. 3A shows an electric current varying with time and used for charging or discharging the electricity storing section of the electric storage device in accordance with the first embodiment of the present invention.
Figure 3B:
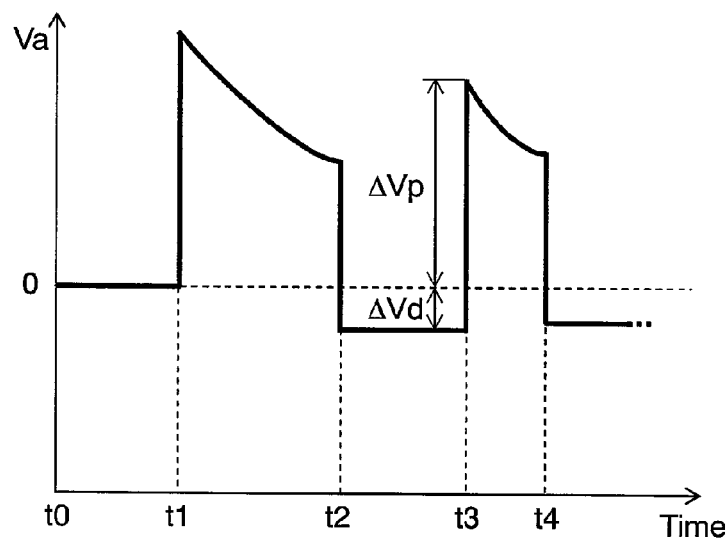
FIG. 3B shows an input voltage varying with time and supplied to a peak voltage holding circuit of the electric storage device in accordance with the first embodiment of the present invention.
Figure 3C:
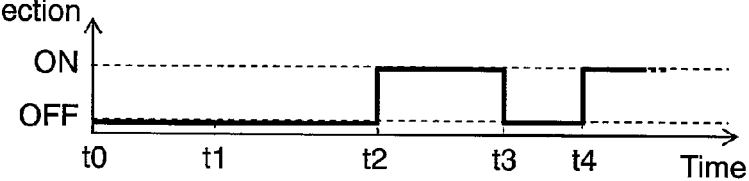
FIG. 3C shows a timing chart of ON and OFF of an ON/OFF circuit of the electric storage device in accordance with the first embodiment of the present invention.
Figure 3D:
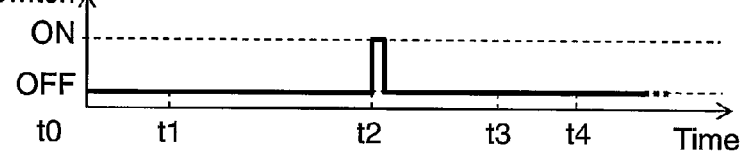
FIG. 3D shows a timing chart of ON and OFF of a reset switch of the electric storage device in accordance with the first embodiment of the present invention.

FIG. 3A shows an electric current varying with time and used for charging or discharging the electricity storing section of the electric storage device in accordance with the first embodiment of the present invention. FIG. 3B shows an input voltage, varying with time, of a peak voltage holding circuit of the electric storage device in accordance with the first embodiment. FIG. 3C shows a timing chart of ON and OFF of the ON/OFF circuit of the electric storage device in accordance with the first embodiment. FIG. 3D shows a timing chart of ON and OFF of the reset switch of the electric storage device in accordance with the first embodiment.

A vehicle is not yet driven during time t0-t1, so that no current flows through electricity storing section 1 as shown in FIG. 3A and the state of I=0 (zero) stays as it is. Input voltage "Va" thus remains at Va=0 as shown in FIG. 3B. A cathode voltage of ON/OFF circuit 17 becomes 0 (zero) volt because of Va=0 volt. An anode voltage thereof becomes also almost 0 volt because the resistance between the negative electrode of electricity storing section 1 and the grounding of current sensing section 15 is extremely small. As a result, ON/OFF circuit 17 stays in OFF state as shown in FIG. 3C. In other words, when current stays at I=0, ON/OFF circuit 17 is controlled to be in off state, and during time t0-t1, since it is not the time to hold a peak value for finding internal resistance "R", reset switch 23 stays turned off as shown in FIG. 3D.

The vehicle is started at time "t1", which prompts positive current +I to flow for charging electricity storing section 1, then voltage "V" rises with time and a voltage-rise occurs in response to internal resistance "R" as shown at time "t0" in FIG. 15. In put voltage "Va" indicating a change amount in voltage "V" rises sharply at time "t1" as shown in FIG. 3B. Then voltage "V" rises approaching to a given inclination along the progress of time "t" in response to the stabilization of positive current "+I". Input voltage Va thus becomes smaller with the progress of time. At this time, the cathode voltage (=Va>0 volt) of ON/OFF circuit 17 is greater than the anode voltage (≈0), so that ON/OFF circuit 17 still remains in off state as shown in FIG. 3C. A finding of peak voltage "ΔVp" to be held may produce a great error therein because of the reason described in FIG. 15, so that reset switch 23 still remains turned off as shown in FIG. 3D.

Since the hybrid vehicle undergoes frequent repetitions of charges and discharges with an unsteady and large current, load 9 consumes a large amount of current with a short lapse of time before time "t2". Electricity storing section 1 supplies negative current "−I" as shown in FIG. 3A, but voltage "V" sharply falls instantaneously at time "t2". Input voltage "Va" thus becomes negative as shown in FIG. 3B. At this time, the cathode voltage of ON/OFF circuit 17 is negative, so that the anode voltage (≈0 volt) thereof is higher than the cathode one (=Va), and thus ON/OFF circuit 17 is turned on automatically as shown in FIG. 3C. This mechanism prompts input voltage "Va" to become a predetermined reference voltage "ΔVd" (=−0.7V) lower than the anode voltage by a voltage drop (≈0.7V) of the diode as shown in FIG. 3B. After that, electricity storing section1 supplies a current to load 9, so that voltage "V" rises; however, input voltage "Va" remains at reference voltage "ΔVd" regardless of changes in voltage "V" because ON/OFF circuit 17 is turned on. At time "t2", controller 21 controls peak voltage holding circuit 19 to be reset for finding internal resistance "R". To be more specific, as shown in FIG. 3D, reset switch 23 is turned on at time "t2", and then turned off immediately thereafter. This action prompts peak holding capacitor 29 to discharge as discussed previously, so that peak voltage "ΔVp" having been held hitherto is reset. At the same time, peak current value "Ip" held by peak current circuit 16 is also reset.

Load 9 ends its current consumption at time "t3", and then electricity storing section 1 is recharged. At this time, as shown in FIG. 3A, current "I" flows reversely (charging direction), and voltage "V" rises, so that input voltage "Va" becomes positive and rises sharply due to internal resistance "R" of electricity storing section 1 as shown in FIG. 3B. This voltage variation (=ΔVp) is greater than input voltage "Va" after time "t3", so that it is held by peak holding capacitor 29 as peak voltage "ΔVp". In a similar way, a maximum current value after time "3" is held as peak current "Ip". Since these peak values reflect internal resistance "R" of electricity storing section 1, controller 21 catches these peak values after time "t3", thereby finding internal resistance "R" from the equation of R=ΔVp/Ip. The operation after time "t3" is similar to that after time "t1", so that the description thereof is omitted here. ON/OFF circuit 17 works at time "t3" similarly at time "t1", so that a detailed description thereof is omitted here, and it is turned off automatically because of Va>0 volt as shown in FIG. 3C.

Peak voltage "ΔVp", similar to as shown in FIG. 2B, is an amount measured from the grounding (=0 volt). The voltage variable range proportionate to internal resistance "R" is a range varied from the negative voltage at time "t3", i.e. ΔVp+Δ, and the amount of reference voltage "ΔVd" is an error in voltage. Since reference voltage "ΔVd" corresponds to a given voltage drop of the diode forming ON/OFF circuit 17 as discussed previously, reference voltage "ΔVd" is a known value (=−0.7 volt). Measuring the peak voltage "ΔVp" thus allows finding accurately a voltage variation range (ΔVp+ΔVd) proportionate to internal resistance "R", which thus can be found accurately.

Capacitance "C" can be found this way: voltage difference "ΔV" (=V2−V1) between voltage "V1" of electricity storing section 1 at any time t and voltage V2 at time t' after a given time passed from time t is found, and a time quadrature value of current variation during the given time, i.e. ∫Idt, should be found. Then capacitance "C" can be found from the equation of C=∫Idt/ΔV.

Capacitance "C" thus found and internal resistance "R" accurately found are respectively compared with a degradation limit, found in advance, of electricity storing section 1, thereby determining accurately how much storing section 1 is degraded. Reliable electric storage device 10 can be thus obtained.

At time "t2", when current "I" flows along the negative direction, or input voltage "Va" is negative, ON/OFF circuit 17 is turned on, and at time "t3", when current "I" flows along the positive direction, or input voltage "Va" is positive, ON/OFF circuit 17 is turned off. Such control as discussed above allows peak voltage holding circuit 19 to hold peak voltage "ΔVp", and then internal resistance "R" of electricity storing section 1 can be accurately found with this peak voltage "ΔVp". In this first embodiment, ON/OFF circuit 17 employs a diode, so that the on-off control can be done automatically, and the electric storage device can be simply structured.

The structure and work discussed above allow accurately finding internal resistance "R" of electricity storing section 1. As a result, the degradation of the electricity storing section can be determined accurately, and the highly reliable electric storage device is thus achievable.

Embodiment 2

Figure 4:
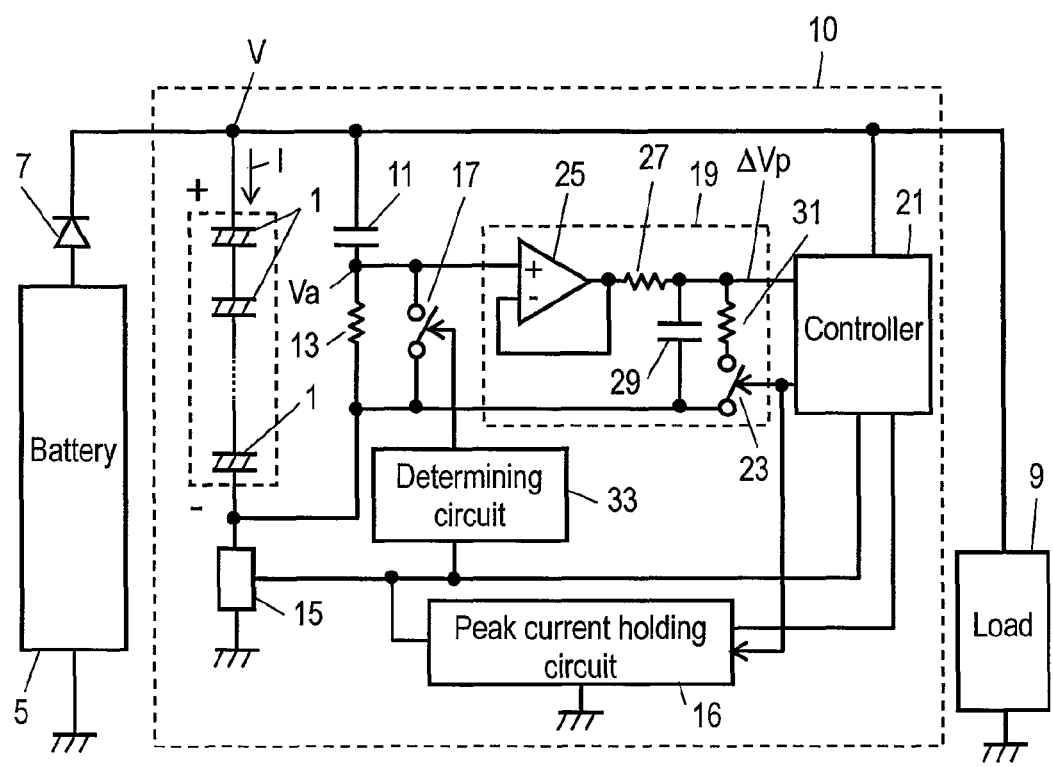
FIG. 4 shows a block diagram of an electric storage device in accordance with a second embodiment of the present invention.

FIG. 4 shows a block diagram of an electric storage device in accordance with the second embodiment of the present invention. In FIG. 4 similar elements to those in FIG. 1 have the same reference marks and the descriptions thereof are omitted here. Electric storage device 10 shown in FIG. 4 differs from that shown in FIG. 1 in the following points:
(1) ON/OFF circuit 17 can be controlled with external signals as reset switch 23 is.
(2) Determining circuit 33 is additionally provided for determining whether a current value of current sensing section 15 is positive or negative, and resultantly issues an on-off signal to ON/OFF circuit 17. To be more specific, determining circuit 33 issues an on-signal when the current value is negative, and issues otherwise an off-signal. The other structural elements remain unchanged from those of the first embodiment.

Figure 5A:
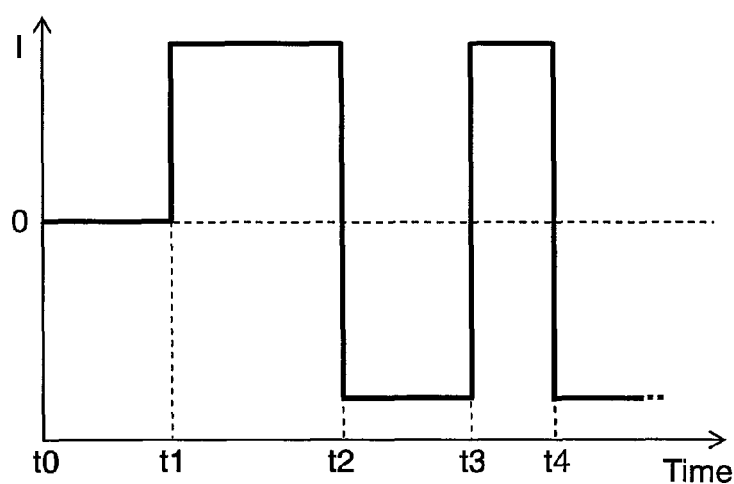
FIG. 5A shows an electric current varying with time and used for charging or discharging an electricity storing section of the electric storage device in accordance with the second embodiment of the present invention.
Figure 5B:
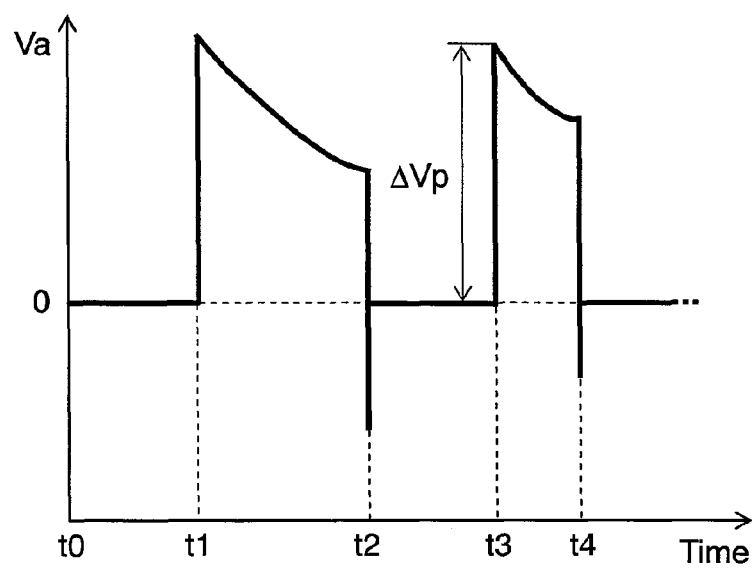
FIG. 5B shows an input voltage varying with time and supplied to a peak voltage holding circuit of the electric storage device in accordance with the second embodiment of the present invention.
Figure 5C:
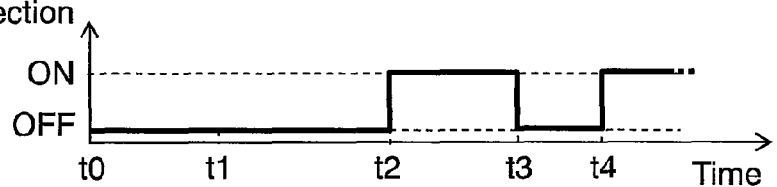
FIG. 5C shows a timing chart of ON and OFF of an ON/OFF circuit of the electric storage device in accordance with the second embodiment of the present invention.
Figure 5D:
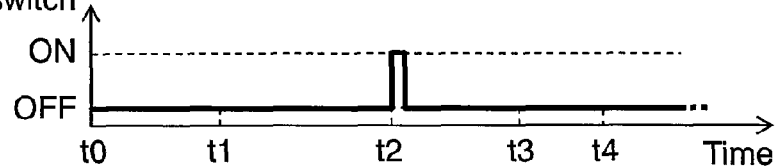
FIG. 5D shows a timing chart of ON and OFF of a reset switch of the electric storage device in accordance with the second embodiment of the present invention.

The work of the foregoing electric storage device 10 is demonstrated hereinafter with reference to FIGS. 5A-5D. FIG. 5A shows an electric current varying with time and used for charging or discharging an electricity storing section of the electric storage device in accordance with the second embodiment of the present invention. FIG. 5B shows an input voltage varying with time and supplied to a peak voltage holding circuit of the electric storage device in accordance with the second embodiment. FIG. 5C shows a timing chart of ON and OFF of the ON/OFF circuit of the electric storage device in accordance with the second embodiment. FIG. 5D shows a timing chart of ON and OFF of the reset switch of the electric storage device in accordance with the second embodiment.

The work of electric storage device 10 between time "t0" and "t2" is the same as that described in the first embodiment, so that the description is omitted here. At time "t2", loads 9 starts consuming a large current, and electricity storing section 1 discharges and supplies negative current "−I" as shown in FIG. 5A. Voltage "V" sharply lowers instantaneously at time "t2", so that input voltage "Va" becomes negative as shown in FIG. 5B. At this time, determining circuit 33 determines a value of current supplied from current sensing section 15 to be negative, and thus circuit 33 immediately issues an on-signal to ON/OFF circuit 17, which is then turned on as shown in FIG. 5C.

ON/OFF circuit 17 in this case is not formed of the diode used in the first embodiment, so that no voltage drop occurs, and when circuit 17 is turned on, it becomes almost conductive and also input voltage "Va" is grounded via current sensing section 15 having an extremely small resistance, so that input voltage "Va" resultantly becomes 0(zero) volt. Input voltage "Va" thus takes a negative value instantaneously at time "t2" as shown in FIG. 5B before ON/OFF circuit 17 is turned on by the determining circuit 33; however, after circuit 17 is turned on, input voltage "Va" stays at a reference voltage, i.e. 0 volt, regardless of changes in voltage "V". At this time "t2", reset switch 23 is turned on before it is turned off instantaneously as shown in FIG. 5D, thereby discharging the electric charges stored hitherto in peak holding capacitor 29.

Load 9 ends its current consumption at time "t3", and then electricity storing section 1 is recharged. At this time, as shown in FIG. 5A, current "I" flows reversely (charging direction), and voltage "V" rises, so that input voltage "Va" becomes positive and rises sharply due to internal resistance "R" of electricity storing section 1 as shown in FIG. 5B. At this time, current "I" takes a positive value, so that determining circuit 33 immediately issues an off-signal to ON/OFF circuit 17, which is then turned off as shown in FIG. 5C. This mechanism allows peak holding capacitor 29 to hold the maximum value of input voltages "Va", and a sharp change (=ΔVp) of input voltage "Va" at time "t3" is greater than any input voltages "Va" after time "t3", so that this peak voltage ΔVp is kept holding.

This peak voltage "ΔVp" is measured from the round (=0 volt) as is conventionally; however, input voltage "Va" stays at 0 volt (reference voltage) between time "t2" and time "t3". The peak voltage "ΔVp" thus can be held as a voltage variation range varied from the reference voltage. Therefore, no voltage error "ΔVe" in peak voltage "ΔVp" occurs although it conventionally occurs. It is also not needed to add a predetermined reference voltage "ΔVd" to "ΔVp" due to a voltage drop of the diode as discussed in the first embodiment. To be more specific, in this second embodiment, peak voltage "ΔVp" per se obtained at time "t3" accurately reflects internal resistance "R" of electricity storing section 1. After time "t3", controller 21 catches "ΔVp" and peak current "Ip" held by peak current holding circuit 16, thereby finding accurate peak voltage "ΔVp" regardless of large and unsteady changes in current "I". As a result, accurate internal resistance "R" is obtainable. Capacitance "C" can be obtained in a similar way to that used in the first embodiment. The accuracy of determining the degradation in electricity storing section 1 can be thus improved by using this capacitance "C" as well as accurate internal resistance "R" discussed above. As a result, highly reliable electric storage device 10 is achievable. The work of storage device 10 after time "t3" is similar to that after time "t1", so that the description thereof is omitted here.

The first embodiment discussed previously has no determining circuit 33, and the on/off control can be done automatically, so that electric storage device 10 can be constructed simply. Since reference voltage "ΔVd" varies a little due to temperature characteristics of the diode, and does not stay at a constant value, on op of that, it has some small errors. On the other hand, the second embodiment does not use the diode, so that reference voltage "ΔVd" has no error. As a result, a more accurate internal resistor "R" can be obtained; however, the second embodiment needs determining circuit 33, and thus the structure becomes somewhat complicated. It should be determined whether a simple structure is important or accuracy is important depending on an application, and an appropriate construction of electric storage device 10 can be chosen.

Figure 6:
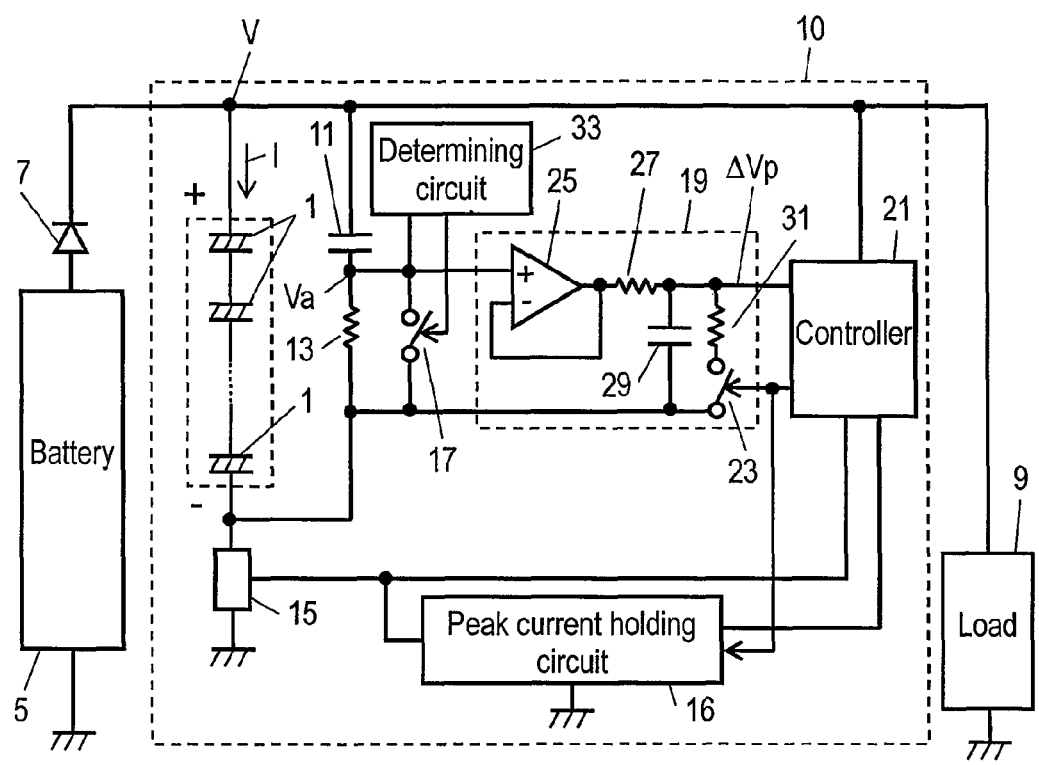
FIG. 6 shows another block diagram of the electric storage device in accordance with the second embodiment of the present invention.

FIG. 6 shows another block diagram of the electric storage device in accordance with the second embodiment. Although, ON/OFF circuit 17 shown in FIG. 4 is controlled with a direction of current "I" flowing to electricity storing section 1, in FIG. 6, it is controlled with + or − of input voltage "Va" supplied to peak voltage holding circuit 19, i.e. the voltage at the junction point between DC blocking capacitor 11 and resistor 13. To be more specific, the advantage of the structure shown in FIG. 6 is that input voltage "Va" is supplied to determining circuit 33. This advantage allows determining circuit 33 to issue an on-signal when input voltage "Va" is negative, thereby turning on ON/OFF circuit 17, and it otherwise turns off circuit 17.

The structure discussed above allows electric storage device 10 to work exactly the same as shown in FIG. 5, namely, at time "t2", negative current "I" prompts determining circuit 33 to turn on immediately ON/OFF circuit 17 in the structure shown in FIG. 4; on the other hand, the instant when input voltage "Va" becomes negative prompts determining circuit 33 to turn on ON/OFF circuit 17 shown in FIG. 6. At time "t3", positive current "I" prompts determining circuit 33 to turn off circuit 17 shown in FIG. 4; on the other hand, positive input voltage "Va" prompts circuit 33 to turn off circuit 17 shown in FIG. 6. The structure shown in FIG. 6 resultantly works in the same way as that shown in FIG. 4, so that the structure shown in FIG. 6 can also accurately find internal resistor "R". Either one of the structures shown in FIG. 4 or FIG. 6 can be used.

The structures and the works discussed above prove that internal resistor "R" of electricity storing section 1 can be more accurately found, so that the degradation can be more accurately determined, and the highly reliable electric storage device is thus achievable.

Embodiment 3

Figure 7:
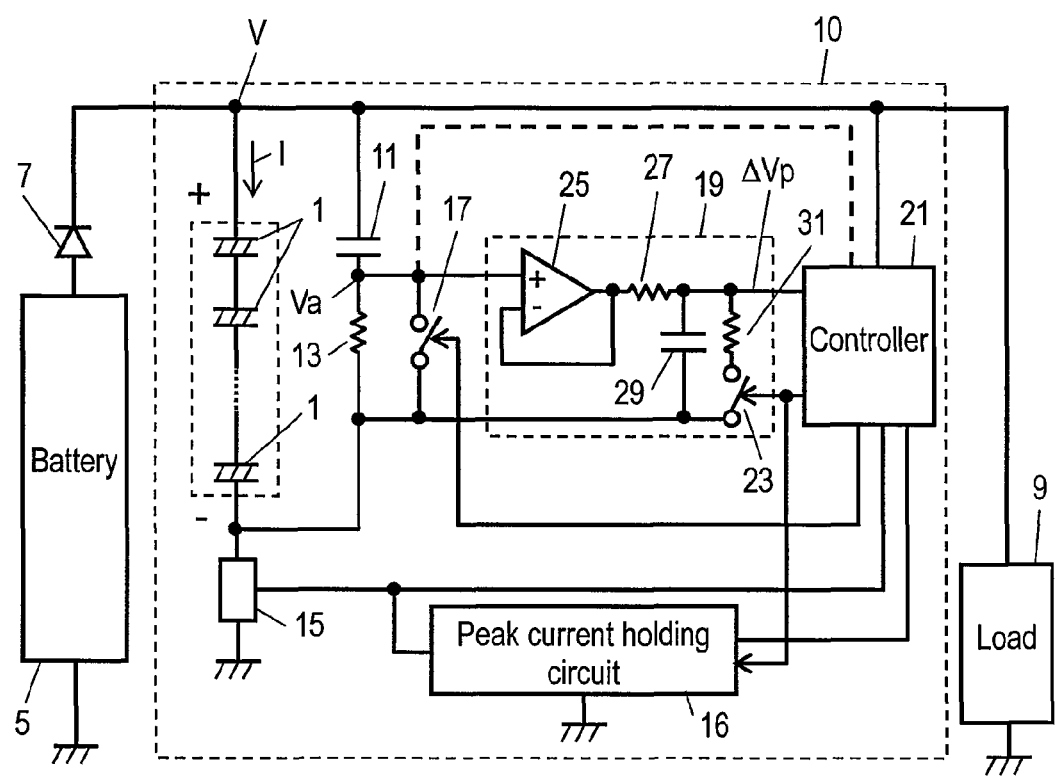
FIG. 7 shows a block diagram of an electric storage device in accordance with a third embodiment of the present invention.

FIG. 7 shows a block diagram of an electric storage device in accordance with the third embodiment of the present invention. In FIG. 7, similar elements to those in FIG. 1 have the same reference marks, and the descriptions thereof are omitted here.

Electric storage device 10 shown in FIG. 7 differs from that shown in FIG. 1 in the following points:
(1) ON/OFF circuit 17 can be controlled with external signals as reset switch 23 is.
(2) ON/OFF circuit 17 is controlled by controller 21. For this purpose, controller 21 receives a current value of current sensing section 15 as well as a voltage value at the junction point between DC blocking capacitor 11 and resistor 13. The current value or the voltage value is determined its + or − with the software of controller 21 for issuing an on-off signal. The other structural elements remain unchanged from those used in the first embodiment.

FIG. 7 shows the structure which allows controller 21 to issue an on-off signal based on + or − of current "I" supplied from current sensing section 15. This structure can be modified to this: controller 21 issues an on-off signal based on + or − of input voltage "Va" supplied to peak voltage holding circuit 19, i.e. based on + or − of a voltage at the junction point between DC blocking capacitor 11 and resistor 13. In this case, as shown with bold-dotted lines in FIG. 7, wirings which connect the junction point to controller 21 should be added, and the software of controller 21 should be modified such that the determination is done on + or − of input voltage "Va" instead of + or − of current "I".

Since the determining operation supposed to be done by circuit 33 is done by the software of controller 21 in this third embodiment, although it is done by the circuit in the second embodiment, the work of electric storage device 10 discussed above is exactly the same as that shown in FIG. 5. Therefore, peak voltage "ΔVp" to be held can be also accurately found, so that the same advantage can be obtained as that obtained in the second embodiment. On top of that, this third embodiment can eliminate determining circuit 33 which is needed in the second embodiment, so that peak voltage "ΔVp" to be held can be found accurately with a simpler structure.

The structures and the works discussed above prove that internal resistor "R" of electricity storing section 1 can be more accurately found with the simpler structure, so that the degradation can be more accurately determined, and the highly reliable electric storage device is thus achievable.

Embodiment 4

Figure 8:
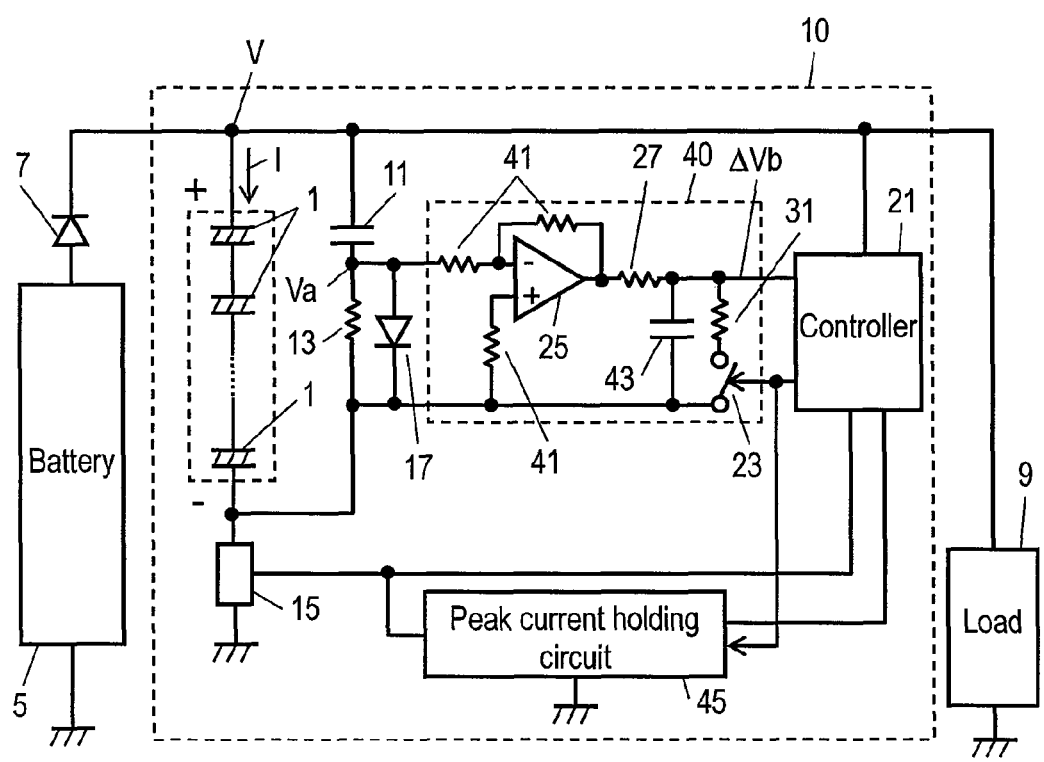
FIG. 8 shows a block diagram of an electric storage device in accordance with a fourth embodiment of the present invention.

FIG. 8 shows a block diagram of an electric storage device in accordance with the fourth embodiment of the present invention. In FIG. 8, similar elements to those in FIG. 1 have the same reference marks, and the detailed descriptions thereof are omitted here. Electric storage device 10 shown in FIG. 8 has the following structural advantages over the structure shown in FIG. 1:
(1) Peak voltage holding circuit 19 is replaced with bottom voltage holding circuit 40 for finding a minimum variable range of input voltage "Va".
(2) The forgoing replacement entails that a bottom voltage is held when input voltage "Va" stays negative, so that OP amp 25 works as a differential amplifier provided with three resistors 41 thereabout as shown in FIG. 8.
(3) Peak holding capacitor 29 is replaced with bottom holding capacitor 43, yet the capacitance as well as connected place thereof remains unchanged from those of capacitor 29.
(4) Peak current holding circuit 16 is replaced with bottom current holding circuit 45 for finding an absolute maximum current value of current sensing section 15, yet the structure of circuit 45 remains unchanged from that of bottom voltage holding circuit 40.
(5) ON/OFF circuit 17 formed of a diode is connected to the junction point between DC blocking capacitor 11 and resistor 13 at its anode. The other structures than the foregoing points remain unchanged from those shown in FIG. 1.

The values to be found by peak current holding circuit 16 and bottom current holding circuit 45 are detailed hereinafter. In embodiments 1-3, as FIGS. 3 and 5 tell, when a current value becomes positive, namely, during the charge of electricity storing section 1, internal resistance "R" is found. In other words, peak current holding circuit 16 finds the maximum current value supplied from current sensing section 15.

In this fourth embodiment, as FIGS. 9A-9D tell, when the current value becomes negative, namely, during the discharge from electricity storing section 1, internal resistor "R" is found. In other words, bottom current holding circuit 45 finds the absolute maximum current value supplied from current sensing section 15, because which supplies a negative current.

Next, the work of electricity storing section 10 in accordance with this fourth embodiment is demonstrated hereinafter. The work differs from that demonstrated in the first embodiment in the following point: The first embodiment finds the maximum voltage rising value of input voltage "Va" as peak voltage "ΔVp" to be held, and also finds the maximum current value as peak current "Ip" to be held, thereby obtaining internal resistor "R". On the other hand, this fourth embodiment finds the maximum voltage falling value of input voltage "Va" as bottom voltage "ΔVb" to be held, and also finds the absolute maximum current value as bottom current "Ib" to be held, thereby obtaining internal resistor "R". The difference is thus the way of obtaining internal resistor "R", i.e. use of peak voltage "ΔVp" and peak current "Ip", or use of bottom voltage "ΔVb" and bottom current "Ib".

FIG. 9A shows an electric current varying with time and used for charging or discharging the electricity storing section of the electric storage device in accordance with the fourth embodiment of the present invention. FIG. 9B shows an input voltage varying with time and supplied to the bottom voltage holding circuit of the electric storage device in accordance with the fourth embodiment. FIG. 9C shows a timing chart of ON and OFF of the ON/OFF circuit of the electric storage device in accordance with the fourth embodiment. FIG. 9D shows a timing chart of ON and OFF of the reset switch of the electric storage device in accordance with the fourth embodiment. A specific example of how to find internal resistance "R" is demonstrated hereinafter with reference to FIGS. 9A-9D. This example uses bottom voltage "ΔVb" to be held and bottom current "Ib" to be held. The current flowing direction is defined similarly to that shown in FIG. 1, i.e. the positive direction is a flow from the positive electrode of electricity storing section 1 to the negative electrode. The charge to electricity storing section 1 thus needs positive current (+I) and the discharge therefrom needs a negative current (−I).

During time "t0"-time "t1", a vehicle is not driven yet, and the state of this period is the same as that described in the first embodiment, so that the description thereof is omitted here.

Next, the vehicle is started up at time "t1", and positive current "+I" flows for charging electricity storing section 1 as shown in FIG. 9A. Voltage "V" of storing section 1 then rises with time and a voltage-rise occurs in response to internal resistance "R" as indicated at time "t0" shown in FIG. 15. Input voltage "Va" indicating a change amount in voltage "V" sharply rises at time "t1" as shown in FIG. 9B. At this time input voltage "Va" is applied to the anode of ON/OFF circuit 17, so that the anode voltage becomes higher than a cathode voltage (≈0 volt). ON/OFF circuit 17 is thus turned on at time "t1" as shown in FIG. 9C, and the anode is grounded via circuit 17 and current sensing circuit 15, whereby input voltage "Va" stays at a predetermined value. Since ON/OFF circuit is formed of a diode, the anode voltage becomes higher by a voltage drop (=reference voltage ΔVs=0.7 volt) than the cathode voltage. Since the cathode voltage is 0 volt, input voltage "Va" becomes the predetermined reference voltage "ΔVd" (=0.7 volt). Thus positive current "+I" or positive input voltage "Va" prompts input voltage "Va" becomes predetermined reference voltage "ΔVd" regardless of changes in voltage "V" of electricity storing section 1. Reset switch 23 is turned on at this time "t1" only temporarily and instantaneously as shown in FIG. 9D, thereby discharging the electric charges from bottom holding capacitor 43.

Since the hybrid vehicle undergoes frequent repetitions of charges and discharges with an unsteady and large current, load 9 consumes a large amount of current with a short lapse of time before time "t2". Electricity storing section supplies negative current "−I" due to the discharge as shown in FIG. 9A, but voltage "V" sharply falls instantaneously at time "t2". Input voltage "Va" thus becomes negative as shown in FIG. 9B. At this time, the anode voltage of ON/OFF circuit 17 is negative, so that the cathode voltage (=0 volt) thereof is higher than the anode one (=Va), and thus ON/OFF circuit 17 is turned off automatically as shown in FIG. 9C. This mechanism prompts input voltage "Va" to fall sharply in response to internal resistor "R" as shown in FIG. 9B. This change (=ΔVb) in the voltage is greater than the absolute value of input voltage "Va" after time "t2", so that bottom holing capacitor 43 holds bottom voltage "ΔVb". In a similar way, the maximum absolute value of the current is held as bottom current "Ib". These two bottom values reflects internal resistor "R" of electricity storing sectionl, and controller 21 catches these bottom values after time "t2", thereby finding internal resistance "R" as described later.

Then voltage "V" falls approaching to a given inclination along the progress of time "t" in response to the stabilization of negative current "−I", so that input voltage "Va" becomes greater with time. At this time, since the anode voltage (=Va<0 volt) of ON/OFF circuit 17 is smaller than the cathode voltage (=0 volt), ON/OFF circuit 17 still remains in the off state.

Load 9 ends its current consumption at time "t3", and then electricity storing section 1 is recharged. At this time, as shown in FIG. 9A, current "I" flows reversely (charging direction), and voltage "V" rises, so that input voltage "Va" becomes positive and rises sharply due to internal resistance "R" of electricity storing section 1 as shown in FIG. 9B. However, as described at time "t1", ON/OFF circuit 17 is turned on, and insofar as current "I" stays positive after time "t3", input voltage "Va" stays constant at reference voltage "ΔVd". If the value of internal resistance "R" is needed again during the next discharge from electricity storing section 1 to load 9, reset switch 23 can be turned on instantaneously. If the value of "R" is needed not so frequently, reset switch 23 can remain in the off state. The work after time "t3" is similar to that after time "t1", so that the description thereof is omitted here.

Internal resistance "R" can be found accurately in the following way: Bottom voltage "ΔVb" to be held is measured from the ground (=0 volt) as it is done conventionally. A voltage variable range proportionate to internal resistance "R" is a range varied from the positive voltage at time "t2", i.e. ΔVb+ΔVd, and the amount of reference voltage "ΔVd" is an error in voltage. Since reference voltage "ΔVd" corresponds to a given voltage-drop of the diode forming ON/OFF circuit 17 as discussed previously, reference voltage "ΔVd" is a known value (=0.7 volt). Measuring the bottom voltage "ΔVb" thus allows finding accurately a voltage variable range (ΔVb+ΔVd) proportionate to internal resistance "R", which then can be found accurately. Capacitance "C" can be found similarly to what is demonstrated in the first embodiment.

Capacitance "C" thus found and internal resistance "R" accurately found are respectively compared with a degradation limit, found in advance, of electricity storing device 1, thereby determining accurately how much storing section 1 is degraded. Highly reliable electric storage device 10 is thus achievable.

At time "t1", when current "I" flows along the positive direction, or input voltage "Va" is positive, ON/OFF circuit 17 is turned on, and at time "t2", when current "I" flows along the negative direction, or input voltage "Va" is negative, ON/OFF circuit 17 is turned on. Such control as discussed above allows bottom voltage holding circuit 40 to hold bottom voltage "ΔVb", and then internal resistance "R" of electricity storing section 1 can be accurately found with this bottom voltage "ΔVb". In this fourth embodiment, ON/OFF circuit 17 employs a diode, so that the on-off control can be done automatically, and the electric storage device can be simply structured.

The structure and work discussed above allow accurately finding internal resistance "R" of electricity storing section 1. As a result, the degradation of the electricity storing section can be determined accurately, and highly reliable electric storage device 1 is thus achievable.

Embodiment 5

Figure 10:
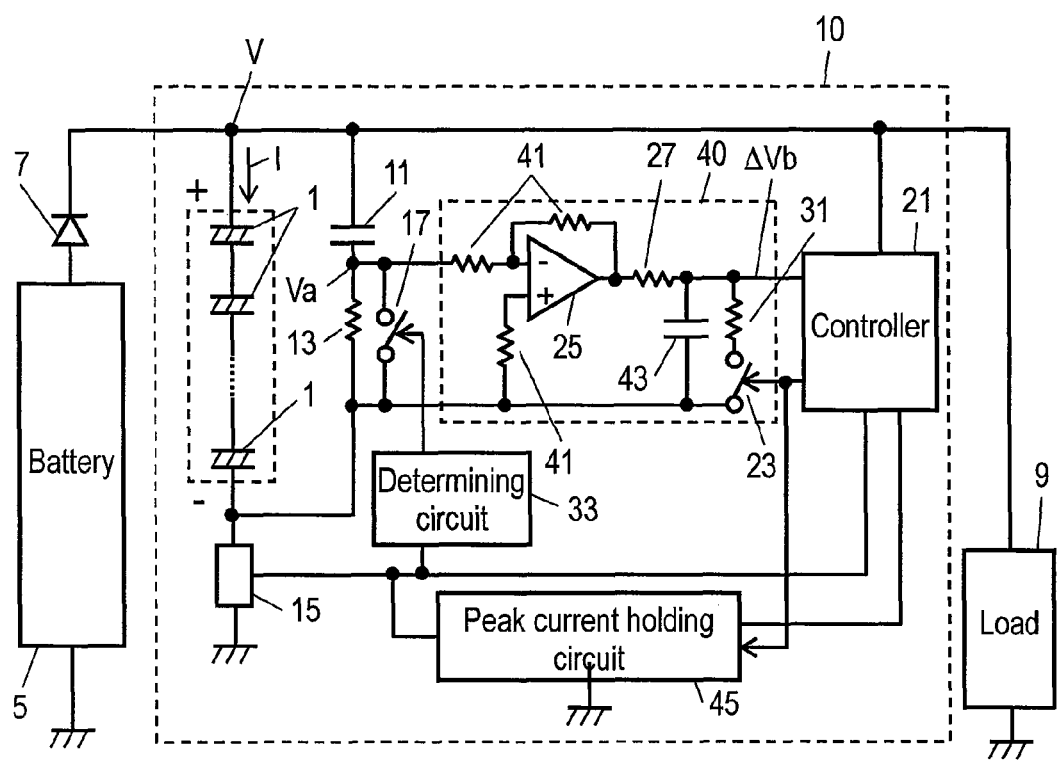
FIG. 10 shows a block diagram of an electric storage device in accordance with a fifth embodiment of the present invention.

FIG. 10 shows a block diagram of the electric storage device in accordance with the fifth embodiment of the present invention. In FIG. 10, similar elements to those used in FIG. 4 have the same reference marks, and the descriptions thereof are omitted here. The structure of this fifth embodiment has an advantage over electric storage device 10 in accordance with the second embodiment in the following point: Peak voltage holding circuit 19 and peak current holding circuit 16 are replaced with bottom voltage holding circuit 40 and bottom current holding circuit 45 in accordance with the fourth embodiment. The structures of circuits 40 and 45 remain unchanged from those shown in FIG. 8.

Figure 11A:
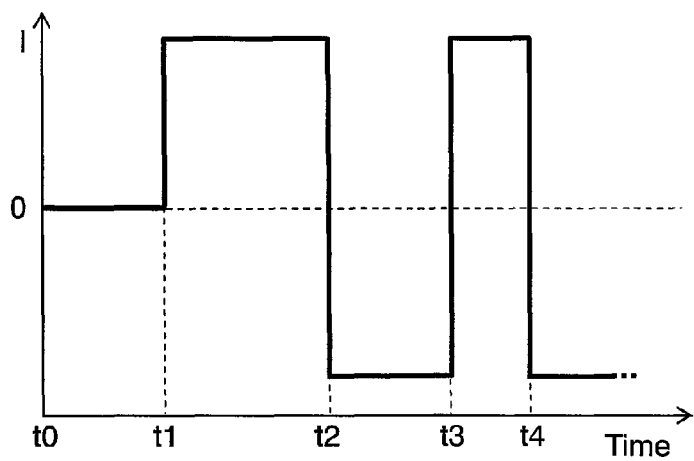
FIG. 11A shows an electric current varying with time and used for charging or discharging an electricity storing section of the electric storage device in accordance with the fifth embodiment of the present invention.
Figure 11B:
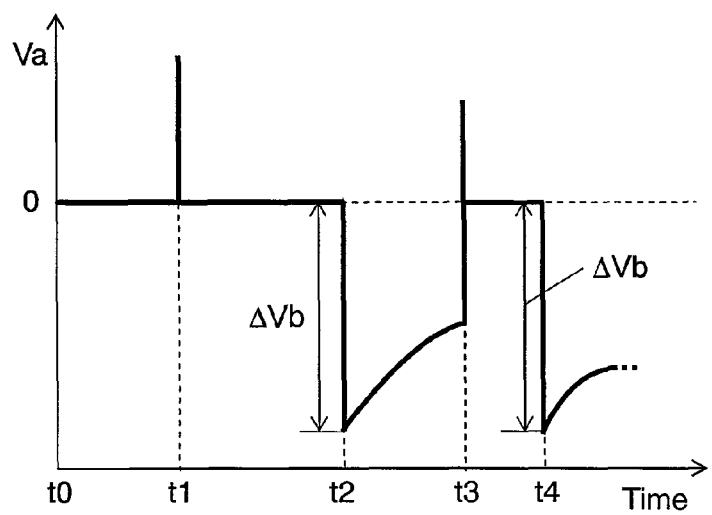
FIG. 11B shows an input voltage varying with time and supplied to a bottom voltage holding circuit of the electric storage device in accordance with the fifth embodiment of the present invention.
Figure 11C:
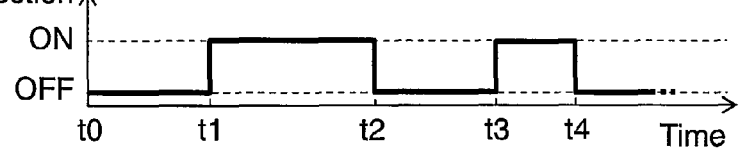
FIG. 11C shows a timing chart of ON and OFF of an ON/OFF circuit of the electric storage device in accordance with the fifth embodiment of the present invention.
Figure 11D:
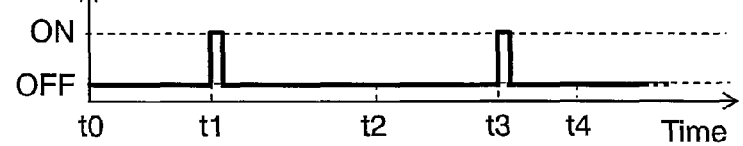
FIG. 11D shows a timing chart of ON and OFF of a reset switch of the electric storage device in accordance with the fifth embodiment of the present invention.

The work of electric storage device 10 discussed above is demonstrated hereinafter with reference to FIGS. 11A-11D. FIG. 11A shows an electric current varying with time and used for charging or discharging the electricity storing section of the electric storage device in accordance with the fifth embodiment of the present invention. FIG. 11B shows an input voltage varying with time and supplied to the bottom voltage holding circuit of the electric storage device in accordance with the fifth embodiment. FIG. 11C shows a timing chart of ON and OFF of the ON/OFF circuit of the electric storage device in accordance with the fifth embodiment. FIG. 11D shows a timing chart of ON and OFF of a reset switch of the electric storage device in accordance with the fifth embodiment. In FIG. 11A-11D, electric storage device 10 works in a similar way during time "t0"-time "t1" to that described in the fourth embodiment, so that the description thereof is omitted here.

A vehicle is started up at time "t1", and positive current "+I" flows to electricity storing section 1 for charging as shown in FIG. 11A, then voltage "V" of storing section 1 rises with time and a voltage-rise occurs in response to internal resistance "R" at time "t0" as shown in FIG. 15, so that input voltage "Va" indicating a change amount in voltage "V" sharply rises at time "t1" as shown in FIG. 11B. Determining circuit 33 turns on ON/OFF circuit 17 when current "I" is positive, where current "I" flows in electricity storing section 1 and sensed by current sensing section 15. ON/OFF circuit 17 is thus turned on at time "t1" as shown in FIG. 11C. This mechanism prompts input voltage "Va" to be grounded via ON/OFF circuit 17 having almost 0 (zero) internal resistance as well as current sensing section 15, so that input voltage "Va" rightly becomes the reference voltage (=0 volt) at time "t1". In other words, as shown in FIG. 11B, input voltage "Va" sharply rises instantaneously before ON/OFF circuit is turned on, and right after this turn-on it returns to 0 volt. Then input voltage "Va" remains at reference voltage (=0 volt) regardless of changes in voltage "V". At this time "t1", reset switch 23 is turned on and then immediately turned off as shown in FIG. 11D, thereby discharging the electric charges stored in bottom holding capacitor 43.

Next, when load 9 consumes a large current at time "t2", electricity storing section 1 discharges and supplies negative current "-I", and voltage "V" sharply falls at the instant of time "t2", so that input voltage "Va" becomes negative as shown in FIG. 11B. At this moment, determining circuit 33 determines that current sensing section 15 supplies a negative current, so that circuit 33 immediately issues an off-signal to ON/OFF circuit 17, which is thus turned off as shown in FIG. 11C. The foregoing mechanism allows bottom holding capacitor 43 to hold the maximum variable value of input voltage "Va". Since the sharp change (=ΔVb) in voltage at time "t2" is greater than an absolute value of input voltage "Va" after time "t2", this bottom voltage (=ΔVb) is held by capacitor 43.

The bottom voltage (=ΔVb) to be held is measured from the ground (=0 volt) as it has been measured conventionally, and since input voltage "Va" stays at the reference voltage (=0 volt) during time "t1"-time "t2", bottom voltage (=ΔVb) can be held as a voltage variable range from the reference voltage. This bottom voltage (=ΔVb) has thus no error "ΔVe" in voltage which occurs in conventional structures. It is not needed to add a given reference voltage "ΔVd" due to a voltage drop of the diode although the addition is done in the fourth embodiment. This fifth embodiment proves that bottom voltage ΔVb per se, which is found at time "t2", reflects accurately internal resistance "R" of electricity storing section 1. Controller 21 catches these bottom values after time "t2", namely, bottom voltage ΔVb to be held and bottom current "Ib" held by bottom current holding circuit 45, thereby finding bottom voltage "ΔVb" accurately regardless of great and unsteady changes in current "I". As a result, internal resistance "R" can be obtained accurately. Capacitance "C" is obtainable similarly to what is discussed in the first embodiment. Accurate values of capacitance "C" and internal resistance "R" allow improving the determination on the degradation limit, so that highly reliable electric storage device 10 is obtainable.

Load 9 ends its current consumption at time "t3", and then electricity storing section 1 is recharged. At this time, as shown in FIG. 11A, current "I" flows reversely (charging direction), and voltage "V" rises, so that input voltage "Va" becomes positive and rises sharply and instantaneously as shown in FIG. 11B. However, as described at time "t1", determining circuit 33 immediately issues an on-signal to ON/OFF circuit 17, which is thus turned on as shown in FIG. 11C. Input voltage "Va" thus becomes 0 (zero) volt, and remains at 0 volt while current "I" stays positive. The work after time "t3" is similar to that after time "t1", so that the description thereof is omitted here.

This fifth embodiment employs no diode in ON/OFF circuit 17 as the second embodiment, so that no error in reference voltage "ΔVd" affects the finding of internal resistance "R", which thus can be obtained more accurately.

Figure 12:
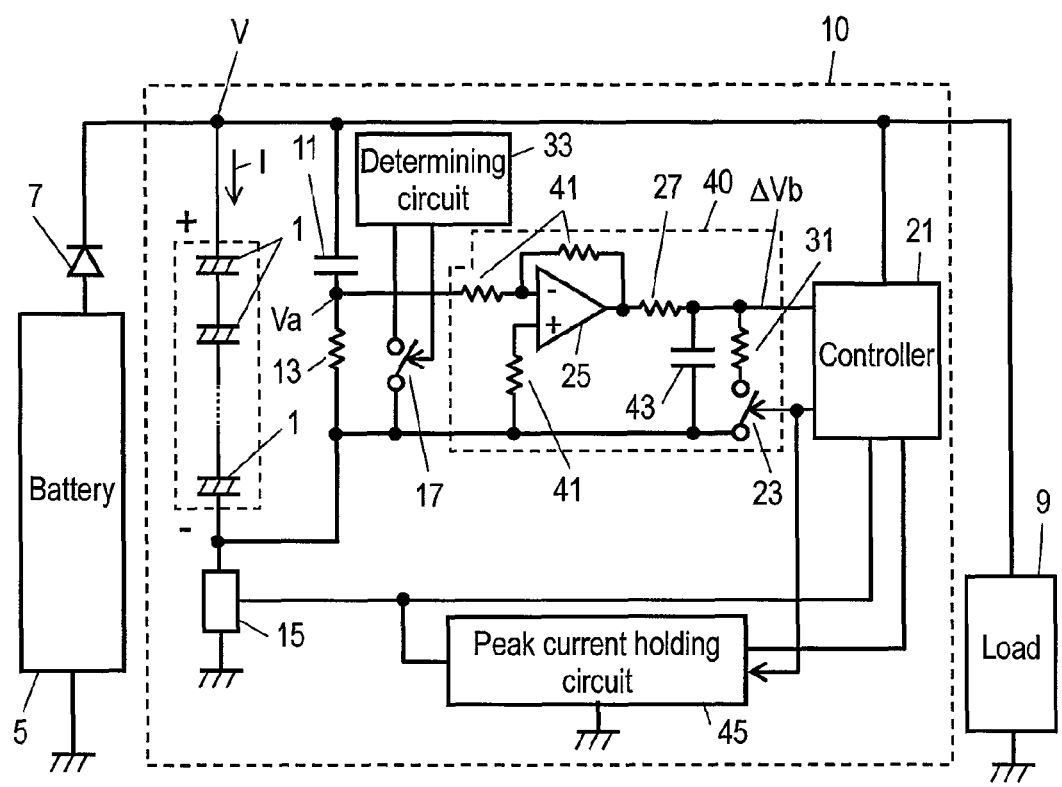
FIG. 12 shows another block diagram of the electric storage device in accordance with the fifth embodiment of the present invention.

FIG. 12 shows another block diagram of the electric storage device in accordance with the fifth embodiment. The structure shown in FIG. 10 turns on or off ON/OFF circuit 17 with + or − of current "I" flowing through electricity storing section 1; however, the structure shown in FIG. 12 turns on or off circuit 17 with + or − of the voltage at the junction point between DC blocking capacitor 11 and resistor 13, i.e. with + or − of input voltage "Va" supplied to bottom voltage holding circuit 40. To be more specific, peak voltage holding circuit 19 and peak current holding circuit 16 in FIG. 6 are replaced with bottom voltage holding circuit 40 and bottom current holding circuit 45 in FIG. 12. The structure shown in FIG. 12 thus allows determining circuit 33 to issue an on-signal, thereby turning on ON/OFF circuit 17 when input voltage "Va" is positive, and circuit 33 otherwise turns off ON/OFF circuit 17.

The structure discussed above works just the same as that shown in FIG. 11 works, in other words, at time "t1" although the structure shown in FIG. 10 allows determining circuit 33 to turn on ON/OFF circuit 17 right after current "I" becomes positive, the structure shown in FIG. 12 allows determining circuit 33 to turn on circuit 17 instantly when input voltage "Va" falls into a positive value. At time "t2" although the structure shown in FIG. 10 allows determining circuit 33 to turn off ON/OFF circuit 17 when current "I" becomes negative, the structure shown in FIG. 12 allows circuit 33 to turn off circuit 17 when input voltage "Va" falls into a negative value. The structure shown in FIG. 12 thus resultantly works similarly to the structure shown in FIG. 10, so that internal resistor "R" can be also found accurately. Either structure shown in FIG. 10 or FIG. 12 thus can be used.

The structure and work discussed above allow finding internal resistance "R" of electricity storing section 1 more accurately. As a result, the degradation of the electricity storing section can be determined accurately, and a highly reliable electric storage device is thus achievable.

Embodiment 6

Figure 13:
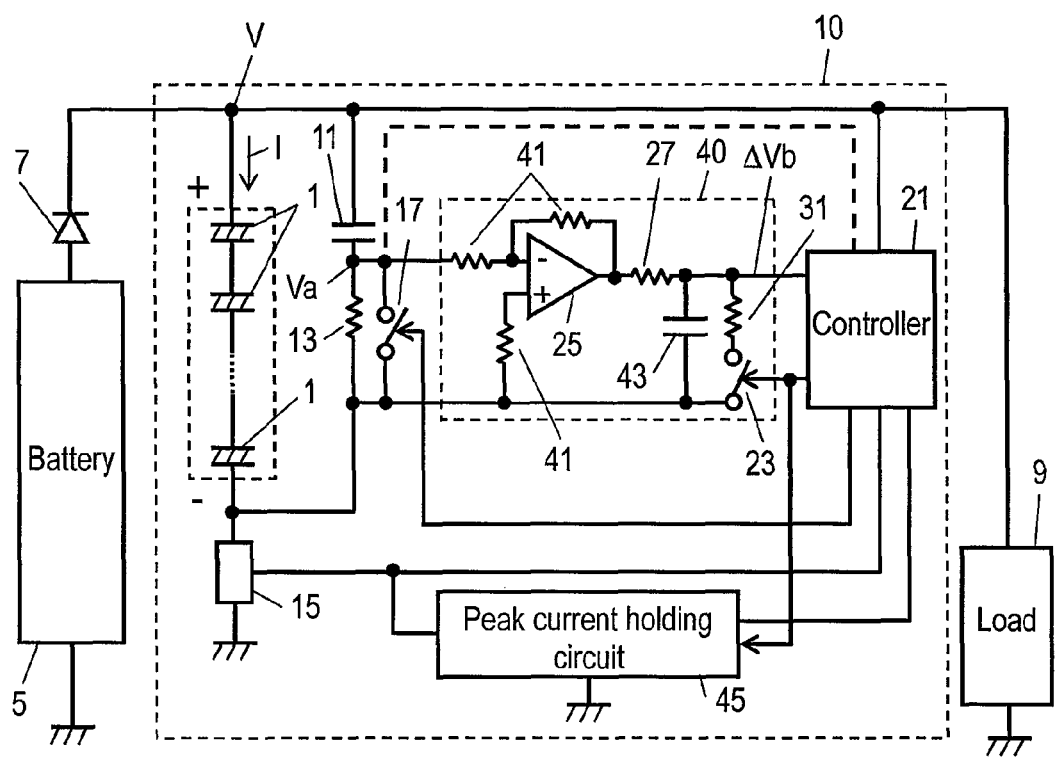
FIG. 13 shows a block diagram of an electric storage device in accordance with a sixth embodiment of the present invention.
Figure 14:
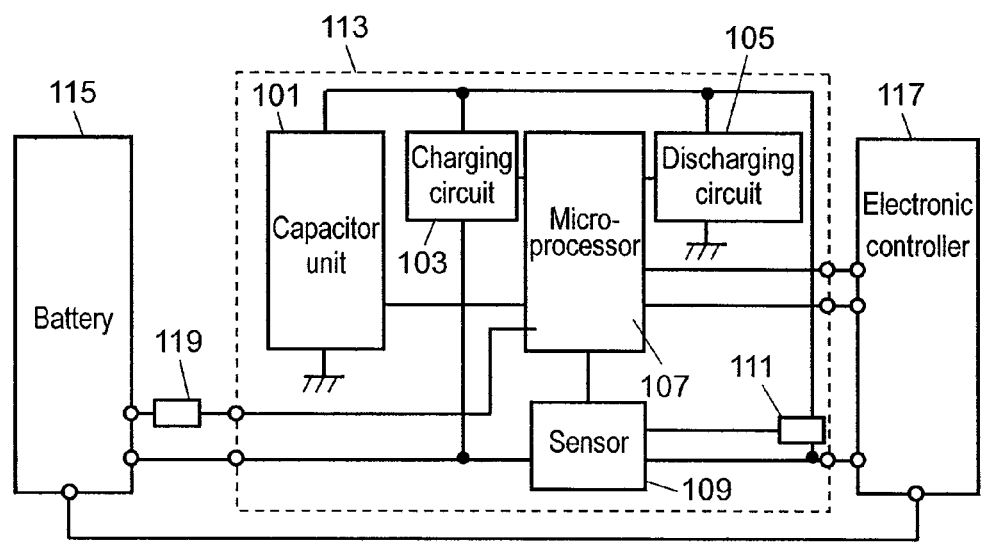
FIG. 14 shows a block diagram of a conventional electric storage device.

FIG. 13 shows a block diagram of the electric storage device in accordance with the sixth embodiment of the present invention. In FIG. 13, similar elements to those used in FIG. 8 have the same reference marks, and the descriptions thereof are omitted here. The structure of this sixth embodiment differs from electric storage device 10 in accordance with the third embodiment in the following point: Peak voltage holding circuit 19 and peak current holding circuit 16 are replaced with bottom voltage holding circuit 40 and bottom current holding circuit 45 in accordance with the fourth embodiment. The structures of circuits 40 and 45 remain unchanged from those shown in FIG. 8.

FIG. 13 shows the structure which allows controller 21 to issue an on-off signal based on + or − off current "I" supplied from current sensing section 15 that is available in FIG. 8. This structure can be modified to this: Using its software, controller 21 issues an on-off signal based on + or − of input voltage "Va" supplied to bottom voltage holding circuit 40, i.e. based on + or − of a voltage at the junction point between DC blocking capacitor 11 and resistor 13. In this case, as shown with bold dotted line in FIG. 13, wirings which connect the junction point to controller 21 should be added.

The foregoing work of electric storage device 10 is specifically just the same as that described in FIG. 11 because the work done by determining circuit 33 in the fifth embodiment is achieved by the software of controller 21 in this sixth embodiment. Bottom voltage "ΔVb" to be held thus can be accurately found, so that an advantage similar to that obtained in the fifth embodiment can be obtained here. This sixth embodiment needs no determining circuit 33 which is needed in the fifth embodiment, so that bottom voltage "ΔVb" can be accurately obtained with a simpler structure.

The structure and work discussed above allow finding internal resistance "R" of electricity storing section 1 more accurately, and yet the structure can be simpler. As a result, the degradation of the electricity storing section can be determined accurately, and a highly reliable electric storage device is thus achievable.

Embodiments 1-3 refer to the methods of finding internal resistor "R" based on peak voltage "ΔVp" and peak current "Ip" to be held, and these methods should be carried out when electricity storing section 1 is charged. Embodiments 4-6 refer to the method of finding internal resistor "R" based on bottom voltage "ΔVb" and bottom current "Ib" to be held, and these methods should be carried out when electricity storing section 1 is discharged. Whichever the method a user chooses, the user can find the same result.

Embodiments 1-6 show the structures in which multiple electricity storing sections 1 are coupled together; however, the present invention is not limited to those examples. For instance, they can be coupled together in parallel or in series parallel in response to a power specification required to load 9, or they can be formed of a single capacitor. In the case of using multiple electricity storing sections 1, a peak voltage holding circuit or a peak current holding circuit can be coupled to respective electricity storing sections 1.

Embodiments 1-6 refer to the electric storage device employed in the hybrid vehicle; however, the present invention is not limited to this instance. For example, the electric storage device can be used in auxiliary power supply of vehicle. The auxiliary power supply can be used in various systems such as an idling stop system, electric power steering system, electric turbo system, and electrical hydraulic brake of vehicle. The electric storage device can be also used not only in vehicles but also in an emergency backup power supply of other commercial products.

INDUSTRIAL APPLICABILITY

The electric storage device of the present invention improves the accuracy of determining a degree of degradation thereof, so that a highly reliable electric storage device is obtainable. The electric storage device is thus useful for an auxiliary power supply of vehicle or an emergency back-up power supply.

The invention claimed is:

1. An electric storage device comprising:
an electricity storing section for storing electric power;
an electric current sensing section for sensing an electric current flowing through the electricity storing section;
a DC blocking capacitor coupled to a positive electrode of the electricity storing section;
a resistor coupled in series with the DC blocking capacitor and coupled to a negative electrode of the electricity storing section;
an ON/OFF circuit coupled in parallel with the resistor such that first and second terminals of the ON/OFF circuit are connected to respective first and second terminals of the resistor;
a peak voltage holding circuit;
a peak current holding circuit coupled to the electric current sensing section; and
a controller for controlling the peak voltage holding circuit, the peak current holding circuit, and the electric current sensing section,
wherein the ON/OFF circuit is controlled, based on a condition where a direction of an electric current flowing from the positive electrode to the negative electrode of the electricity storing section is a positive direction, such that the ON/OFF circuit is turned on when the electric current flows in a negative direction or a voltage at a junction point between the DC blocking capacitor and the resistor is negative, and such that the ON/OFF circuit is turned off when the electric current flows in the positive direction or a voltage at the junction point between the DC blocking capacitor and the resistor is positive, and
wherein an internal resistor of the electricity storing section is found based on a peak voltage resulting from the control and held by the peak voltage holding circuit as well as a peak current resulting from the control and held by the peak current holding circuit.

2. The electric storage device of claim 1, wherein the ON/OFF circuit is formed of a diode of which cathode is coupled to the junction point between the DC blocking capacitor and the resistor.

3. An electric storage device comprising:
an electricity storing section for storing electric power;

an electric current sensing section for sensing an electric current flowing through the electricity storing section;

a DC blocking capacitor coupled to a positive electrode of the electricity storing section;

a resistor coupled in series with the DC blocking capacitor and coupled to a negative electrode of the electricity storing section;

an ON/OFF circuit coupled in parallel with the resistor such that first and second terminals of the ON/OFF circuit are connected to respective first and second terminals of the resistor;

a bottom voltage holding circuit;

a bottom current holding circuit coupled to the electric current sensing section; and a controller for controlling the bottom voltage holding circuit, the bottom current holding circuit, and the electric current sensing section, wherein the ON/OFF circuit is controlled, based on a condition where a direction of an electric current flowing from the positive electrode to the negative electrode of the electricity storing section is a positive direction, such that the ON/OFF circuit is turned on when the electric current flows in the positive direction or a voltage at a junction point between the DC blocking capacitor and the resistor is positive, and such that the ON/OFF circuit is turned off when the electric current flows in a negative direction or a voltage at the junction point between the DC blocking capacitor and the resistor is negative, and wherein an internal resistor of the electricity storing section is found based on a bottom voltage resulting from the control and held by the bottom voltage holding circuit as well as a bottom current resulting from the control and held by the bottom current holding circuit.

4. The electric storage device of claim 3, wherein the ON/OFF circuit is formed of a diode of which cathode is coupled to the junction point between the DC blocking capacitor and the resistor.

5. The electric storage device of claim 1 further comprising a determining circuit for determining whether a voltage at the junction point between the DC blocking capacitor and the resistor is positive or negative, wherein the ON/OFF circuit can be controlled its turn-on or turn-off with an external signal, and wherein the determining circuit issues an on-off signal for turning on or turning off the ON/OFF circuit.

6. The electric storage device of claim 1, wherein the ON/OFF circuit can be controlled its turn-on or turn-off with an external signal, and the controller receives a current from the current sensing section or a voltage at the junction point between the DC blocking capacitor and the resistor, and wherein the controller determines whether the current supplied from the current sensing section or the voltage at the junction point is positive or negative for issuing an on-off signal, which turns on or turns off the ON/OFF circuit.

7. The electric storage device of claim 3 further comprising a determining circuit for determining whether a voltage at the junction point between the DC blocking capacitor and the resistor is positive or negative, wherein the ON/OFF circuit can be controlled its turn-on or turn-off with an external signal, and wherein the determining circuit issues an on-off signal for turning on or turning off the ON/OFF circuit.

8. The electric storage device of claim 3, wherein the ON/OFF circuit can be controlled its turn-on or turn-off with an external signal, and the controller receives a current from the current sensing section or a voltage at the junction point between the DC blocking capacitor and the resistor, and wherein the controller determines whether the current supplied from the current sensing section or the voltage at the junction point is positive or negative for issuing an on-off signal, which turns on or turns off the ON/OFF circuit.

* * * * *